United States Patent
Poplack et al.

(10) Patent No.: US 11,520,531 B1
(45) Date of Patent: Dec. 6, 2022

(54) SYSTEMS AND METHODS FOR INTERCYCLE GAP REFRESH AND BACKPRESSURE MANAGEMENT

(71) Applicant: Cadence Design Systems, Inc., San Jose, CA (US)

(72) Inventors: Mitchell G. Poplack, San Jose, CA (US); Justin Schmelzer, San Jose, CA (US); Aruna Aluri, Saratoga, CA (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 17/139,163

(22) Filed: Dec. 31, 2020

(51) Int. Cl.
    G06F 3/06 (2006.01)
    G06F 11/34 (2006.01)

(52) U.S. Cl.
    CPC .......... *G06F 3/0664* (2013.01); *G06F 3/0619* (2013.01); *G06F 3/0653* (2013.01); *G06F 3/0656* (2013.01); *G06F 3/0659* (2013.01); *G06F 3/0679* (2013.01); *G06F 11/348* (2013.01)

(58) Field of Classification Search
    CPC .... G06F 3/0619; G06F 3/0653; G06F 3/0656; G06F 3/0659; G06F 3/0679
    See application file for complete search history.

(56) References Cited

U.S. PATENT DOCUMENTS

| | | | |
|---|---|---|---|
| 11,249,688 B2* | 2/2022 | Foo | G06F 3/0659 |
| 2005/0166009 A1* | 7/2005 | Proebsting | G11C 7/065 |
| | | | 257/E21.659 |
| 2005/0267730 A1* | 12/2005 | Kfir | G06F 30/331 |
| | | | 703/26 |
| 2017/0192697 A1* | 7/2017 | Munetoh | G06F 5/12 |
| 2017/0255728 A1* | 9/2017 | Wakefield | G06F 11/261 |
| 2020/0049764 A1* | 2/2020 | Asaad | G01R 31/31727 |
| 2021/0005244 A1* | 1/2021 | Hiscock | G11C 11/4096 |

* cited by examiner

*Primary Examiner* — Edward J Dudek, Jr.
(74) *Attorney, Agent, or Firm* — Foley & Lardner LLP

(57) ABSTRACT

A system may include a synchronization device and an emulation chip including a processor and a memory. The processor may evaluate, during a first cycle, at least one of a set of one or more execution instructions in the memory or evaluation primitives configured to emulate a circuit, and evaluate, during a second cycle, at least one of the set of one or more execution instructions or a set of configured logic primitives. The synchronization device may interpose a gap period interposed between the first cycle and the second cycle such that during the gap period, the processor does not evaluate one or more instructions from the set of one or more execution instructions or re-evaluate primitives. The synchronization device may cause, during the first gap period, the emulation chip to perform refreshes on the memory of the emulation chip.

20 Claims, 11 Drawing Sheets

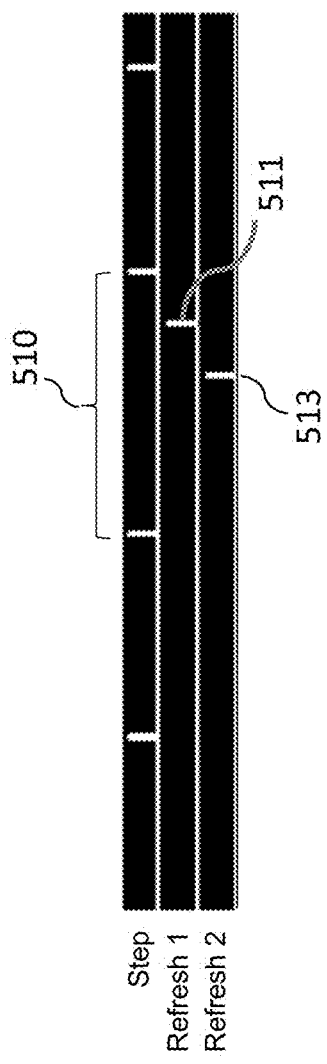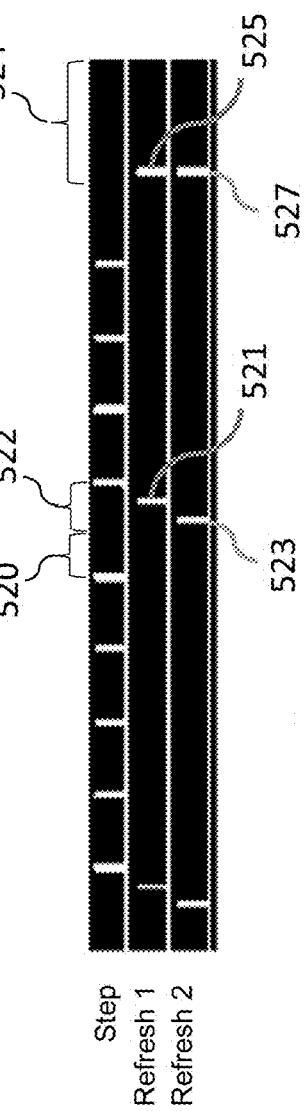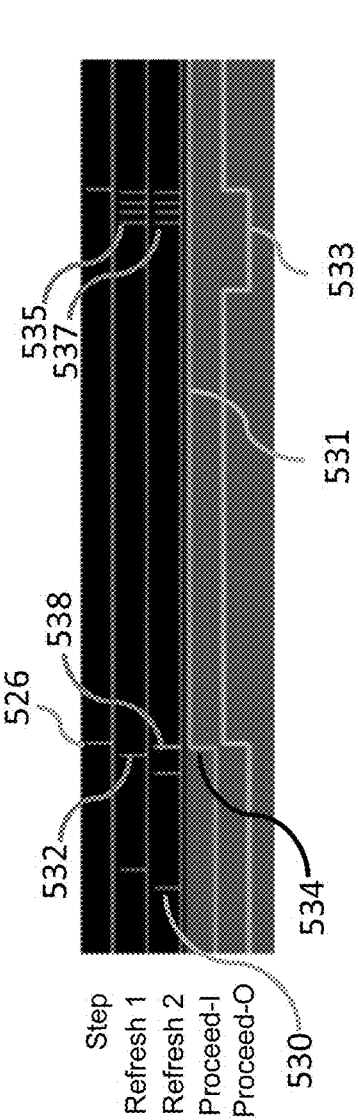

SYSTEMS AND METHODS FOR INTERCYCLE GAP REFRESH AND BACKPRESSURE MANAGEMENT

TECHNICAL FIELD

This application is generally directed towards processor-based emulation systems, and more specifically towards systems and methods for performing refreshes on memories of an emulation system by a synchronization subsystem and performing a backpressure management in a trace collection in the emulation system.

BACKGROUND

Modern semiconductor based integrated circuits (ICs) are incredibly complex and contain millions of circuit devices, such as transistors, and millions of interconnections between the circuit devices. Designing such complex circuits cannot be accomplished manually, and circuit designers use computer based Electronic Design Automation (EDA) tools for synthesis, debugging, and functional verification of the ICs. A significant function of the EDA tools is emulation of a user's logical system (e.g., an IC design) to perform pre-silicon functional verification, firmware and software development, and post-silicon debug. To achieve this, a typical processor-based emulation system includes several Application Specific Integrated Circuits (ASICs), often referred to as emulation ASICs or emulation chips, all working together to execute a program generated by an emulation compiler generated from the user's IC design. The compiled program models a design under test (DUT) that is a logical representation of the user's IC design running on several emulation ASICs of the emulation system.

In an execution mode in the emulation system, all emulation processors in emulation chips which are allocated to particular job can execute the same instruction index according to their local control words (e.g., control store words (CSWs)). The compiler can determine and place instructions in the available time slots in each of the emulation chips (e.g., stepping), taking into account data dependencies, transmission delays, etc., such that the program as a whole accomplishes the execution of a model equivalent to one cycle of the user's DUT.

In the chip emulating context, implementation of handshaking between chips or processors is impractical because it would produce too many communications of signals between chips or processors. Without synchronization of signals, the emulation compiler would need to know in advance "everything" on exactly when those signal communications occur between which chips or processors. To reduce the number of communications of signals and avoid complex compiler design, the emulation system can perform synchronization of signals between chips or processors.

Due to a bit cell architecture of a memory (e.g., dynamic random-access memory (DRAM) in which data is stored on a capacitor, which gradually loses charge through parasitic resistance), refreshes may be needed on a regular basis. Memory refresh is the process of periodically reading information from an area of computer memory and immediately rewriting the read information to the same area without modification, for the purpose of preserving the information. For example, in a DRAM chip, as time passes, charges in the memory cells leak away and the stored data would eventually be lost. To prevent this, external circuitry periodically performs refreshes, e.g., reads each cell and rewrites it, restoring the charge on the capacitor to an original level.

Memory refresh takes times, but a normal system can efficiently handle memory refresh using a cache or a scheme in which all refreshes are statically scheduled. However, in an emulation system that performs synchronization of signal between chips or processors, statically scheduling refreshes to every memory in the system during every emulation cycle can result in too much time reserved for refresh, as the static scheduling paradigm reserves the same period in every emulation cycle, even if it results in more refreshes to the memories than required by the memory itself. In this case, the overall performance of the system suffers. Therefore, there is need for performing refreshes in a chip to be in synchronization with refreshes in one or more other chips.

In hardware-based emulations, emulation chips or an emulation system may collect data or trace and store into memory so as to generate waveform of signals indicating what happened during an emulation. Occasionally, the size of data or trace which is being produced by emulation chips may exceed a throughput of a trace collection system for an extended period of time. In particular, the amount of data may depend of the degree to which the trace data can be compressed, which varies over time as the character of the raw trace data produced varies. There is need for a mechanism to handle this inconsistency between the overproduced data or trace and the throughput of the trace collection system.

SUMMARY

Embodiments of the present disclosure relate to system and method for performing refreshes on memories of an emulation system by a synchronization subsystem and performing a backpressure management in a trace collection in the emulation system.

In an embodiment, an emulation system may include a first emulation chip and a first synchronization device, the first emulation chip including an execution processor, a user memory and an instruction memory configured to store one or more instructions. A method of refreshing memories of the emulation system may include executing, by the execution processor of the first emulation chip during a first cycle, a set of one or more execution instructions stored in the instruction memory. The method may further include executing, by the execution processor of the first emulation chip during a second cycle, the set of one or more execution instructions. The method may further include interposing, by the first synchronization device, a first gap period interposed between the first cycle and the second cycle such that during the first gap period. The execution processor does not execute one or more instructions from the set of one or more execution instructions in an embodiment. The method may further include causing, by the first synchronization device during the first gap period, the first emulation chip to perform refreshes on the user memory of the first emulation chip.

In another embodiment, a system may include a first emulation chip and a first synchronization device. The first emulation chip may include an execution processor, a user memory and an instruction memory configured to store one or more instructions. The execution processor of the first emulation chip may be configured to execute, during a first cycle, a set of one or more execution instructions stored in the instruction memory. The execution processor of the first emulation chip may be configured to execute, during a second cycle, the set of one or more execution instructions. The first synchronization device may be configured to interpose a first gap period between the first cycle and the second cycle such that during the first gap period, the execution processor does not execute one or more instructions from the set of one or more execution instructions. The first synchronization device may be configured to cause, during the first gap period, the first emulation chip to perform refreshes on the user memory of the first emulation chip.

In yet another embodiment, in an emulation system including a first emulation chip and a first synchronization device, the first emulation chip including an execution processor, a trace controller, a user memory and an instruction memory configured to store one or more instructions, a method of refreshing memories may include receiving, at a first-in first-out (FIFO) queue of the trace controller, an output of the execution processor to generate a trace from an output of the FIFO queue. The method may include determining, by the trace controller, whether at least a predetermined percentage of the FIFO queue is full. The method may include in response to determination that at least the predetermined percentage of the FIFO queue is full, causing, by the trace controller, the first synchronization device to stop issuing to the first emulation chip a signal indicating a start of a cycle during which a set of one or more execution instructions stored in the instruction memory are executed. The method may include interposing, by the first synchronization device, a first inter-cycle gap period during which no instructions from the set of one or more execution instructions are executed. The method may include causing, by the first synchronization device during the first inter-cycle gap period, the first emulation chip to perform refreshes on the user memory of the first emulation chip.

BRIEF DESCRIPTION OF THE DRAWINGS

The accompanying drawings constitute a part of this specification and illustrate an embodiment of the subject matter described herein.

FIG. 5A to FIG. 5C are schematic diagrams showing illustrative signals generated by a synchronization device in an emulation system, according to some embodiments.

DETAILED DESCRIPTION

Figure 1A:
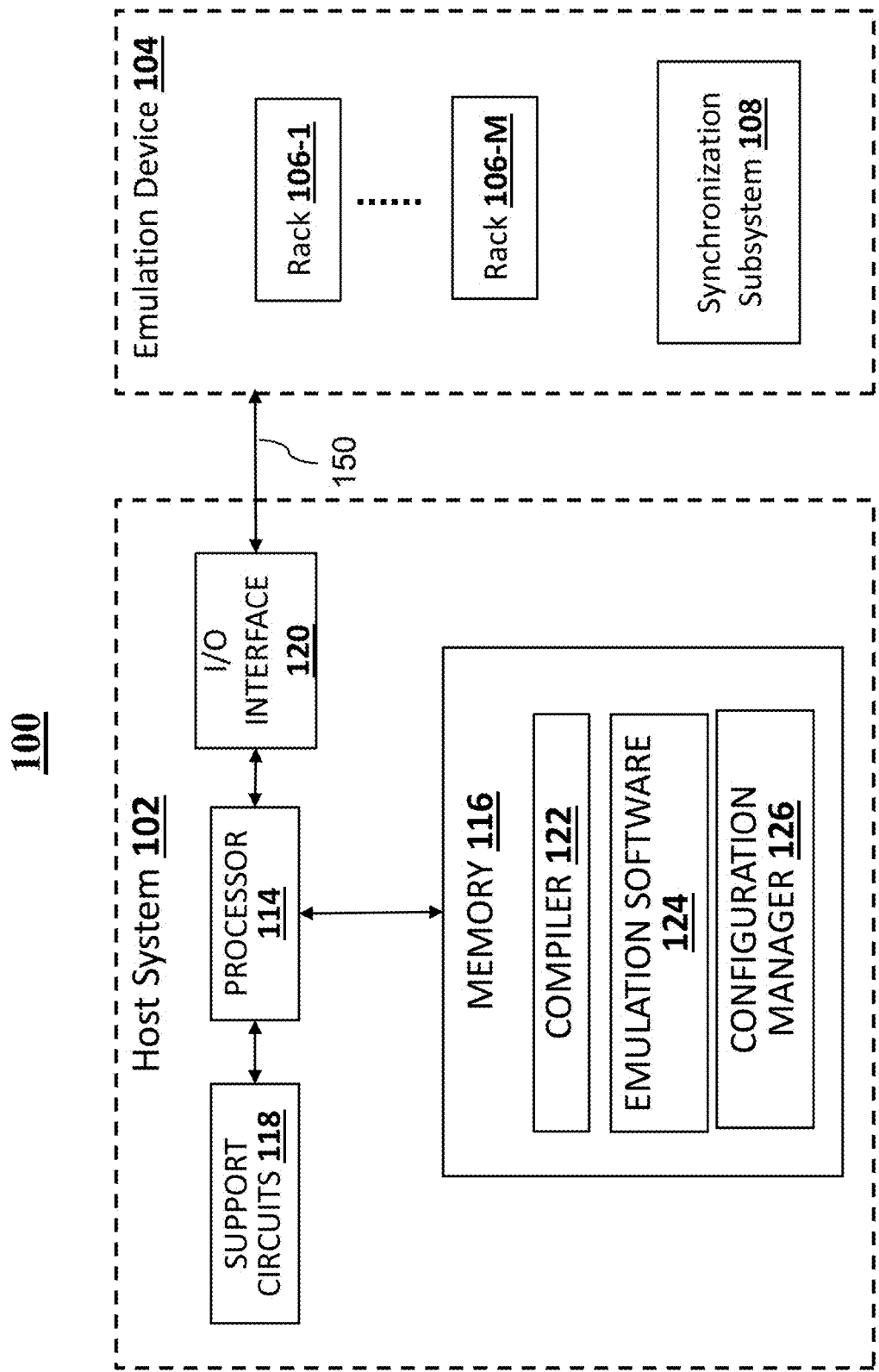
FIG. 1A is a block diagram depicting components of an emulation system, according to some embodiments.

Embodiments disclosed herein describe a system that includes a first emulation chip and a first synchronization device. The first emulation chip may include an execution processor, a user memory and an instruction memory configured to store one or more instructions. The execution processor of the first emulation chip may be configured to execute, during a first cycle, a set of one or more execution instructions stored in the instruction memory. The execution processor of the first emulation chip may be configured to execute, during a second cycle, the set of one or more execution instructions. The first synchronization device may be configured to interpose a first gap period interposed between the first cycle and the second cycle such that during the first gap period, the execution processor does not execute one or more instructions from the set of one or more execution instructions. The first synchronization device may be configured to cause, during the first gap period, the first emulation chip to perform refreshes on the user memory of the first emulation chip. Refreshes may be performed by the first synchronization device instead of a refresh controller of the first emulation chip. As a result, the first synchronization can (1) achieve performance improvement by performing refreshes without interfering with memory accesses, and (2) dynamically throttle the job (for any reason) if necessary.

One problem relating to memory refreshes in hardware-based emulations is that as emulation cycles continue to get shorter, times assigned for memory refreshes in an emulation cycle (e.g., DDR refreshes) occupy a larger portion of the cycle. Furthermore, memory refreshes may affect the performance of other operations that need memory access by requiring them to be delayed, which impacts the emulation system's performance overall. Conventionally, refreshes can be handled with two separate mechanisms. First, during major cycles in which instructions are executed, refreshes can be scheduled by a scheduler (e.g., using scheduled hardware control bits (HCBs) sent by a scheduler). Second, during idle periods (such as when execution of instructions is stopped due to a breakpoint), refreshes can be originated from a separate logic within an emulation chip. This approach needs some extra help in the case where stepping is irregular, for example, due to flow control from a synchronization subsystem. In such a case, it is possible that each emulation cycle is irregularly scheduled and so are the gaps between cycles. Even in these irregularly scheduled cycles, there is need for performing memory refreshes so as to satisfy the refresh requirements in the emulation system. In other words, regardless of the job execution profile, there is need for ensuring that the DRAM refresh requirements are met. In an emulation system, each chip can perform or handle its own refreshes using a controller of the chip (e.g., a user memory controller). The controller can accumulate the number of refreshes (that have not been performed) in a counter and can schedule a pre-delay to give time to refresh until or before a major (or main) cycle starts. For example, the controller can execute or perform refresh one cycle ahead of time before the major cycle starts. However, when inter-cycle gaps with different sizes happen (e.g., due to irregular stepping), it is difficult to schedule a pre-delay because a time when the major cycle starts cannot be accurately predicted.

In an emulation system that performs synchronization of signal between chips or processors, statically scheduling refreshes to every memory in the system during every emulation cycle can result in too much time reserved for refresh, as the static scheduling paradigm reserves the same period in every emulation cycle, even if it results in more refreshes to the memories than required by the memory itself. In this case, the overall performance of the system suffers. Therefore, there is need for performing refreshes between emulation cycles and only as often as needed. This may require the choice of when to perform refreshes in a chip to be in synchronization with refreshes in one or more other chips.

To solve these problems, according to certain aspects, embodiments in the present disclosure relate to techniques for issuing or performing memory refreshes during an inter-cycle gap (e.g., a gap between two consecutive emulation cycles). This gap would not occur every cycle. In some embodiments, it may only occur when intra-cycle refreshes are delivered, which is based on an internal timer of a synchronization subsystem (which is asynchronous from the job state). For example, if cycle frequency is 1 MHz (e.g., the duration of each cycle is 1 μs), refreshes may be performed every four cycles, taking up 280 ns, which is 28% of single cycle duration when statically scheduled every cycle, but only 7% of the overall when performed only as needed. Requirement on the frequency of refreshes may depend on a particular memory technology used in an emulation system. For example, DRAM may require a refresh every 3.9 μs. In some embodiments, instead of scheduling refreshes during a cycle (e.g., intra-cycle refreshes), an emulation system may move refreshes to in-between cycles or to inter-cycle gaps so that refreshes can be performed without interfering with memory accesses. In this manner, refreshes can be performed as frequent as every cycle (during an inter-cycle gap and an extended memory access-free period) if necessary or as rarely as required by the memory. In some embodiments, a refresh duration placed in an inter-cycle gap can be overlapped with a cycle duration, such that during the overlapped duration no memory access can be performed, thereby providing flexibility in issuing or performing refreshes even during a major cycle in which instructions are executed. In some embodiments, refreshes may be performed during an inter-cycle gap or in a duration overlapping a major cycle in a way that is adjusted for each chip to minimize the size of the gap or minimize extra time required in the gap. Even if the schedule (scheduled by a scheduler) is not amenable to such overlapping refresh durations (worst case scenario), a gap extension can be performed only as frequently as necessary. For example, it is possible that such gap extension is not performed every cycle, while refreshes may need to be performed every cycle when the refreshes are handled by scheduled processor instructions.

Another problem relates to collection of signal data or trace. Emulation chips or an emulation system collects data or trace and store into memory so as to generate waveform of signals indicating what happened during an emulation. In doing this process, throughput to write into memory in a trace collection system sometimes does not keep up with capacity of chip. This problem can be solved by providing two different memories—user memory and memory dedicated for data/trace collection (e.g., data capture card (DCC) memory). Alternatively, inline compression can reduce size of data written into memory. However, inline compression does not guarantee the degree of reduction of size of data because the performance of data compression algorithms varies with the character of the data on which it operates.

To solve this problem, according to certain aspects, embodiments in the present disclosure relate to techniques for performing a backpressure management using a first-in first-out (FIFO) queue, for example, causing the emulation chip to stop generation of data when the FIFO queue becomes full. In some embodiments, a backpressure module or device (e.g., trace controller of an emulation chip) may be aware of refresh timing by handling refreshes (for each emulation chip) in a device separate from each emulation chip (e.g., a synchronization device separate from each emulation chip). In some embodiments, the synchronization device handling refreshes (for each chip) can be aware when refreshes are issued, and thus can stop issuing further instructions to each chip to wait until refresh completes. In some embodiments, the synchronization device may generate steps or perform stepping (e.g., schedule execution of instructions). The synchronization device may be aware of both refreshes and backpressure (e.g., via communication with the trace controller of each chip), and the synchronization device thus can control when to generate steps or perform stepping without conflicting with refreshes or backpressure.

In some embodiments, whenever backpressure occurs during a major cycle, a backpressure gap may be random. The synchronization device may control each emulation chip (or a user memory controller (UMC) thereof)) to issue refresh during the backpressure gap. In some embodiments, the synchronization device may be aware of the size of an inter-cycle gap and/or the size of a backpressure gap, determine that refresh completes, and cause the major cycle to resume. In this case, the chip cannot be aware when to issue refresh because the chip cannot be aware of information of gap size (e.g., size of an inter-cycle gap and/or size of a backpressure gap) because backpressure can be required due to any other chip in the system In some embodiments, a system may include a first emulation chip and a first synchronization device. The first emulation chip may include an execution processor, a user memory and an instruction memory configured to store one or more instructions. The execution processor of the first emulation chip may be configured to execute, during a first cycle, a set of one or more execution instructions stored in the instruction memory. The execution processor of the first emulation chip may be configured to execute, during a second cycle, the set of one or more execution instructions. The first synchronization device may be configured to interpose a first gap period between the first cycle and the second cycle such that during the first gap period, the execution processor does not execute one or more instructions from the set of one or more execution instructions. The first synchronization device may be configured to cause, during the first gap period, the first emulation chip to perform refreshes on the user memory of the first emulation chip.

In some embodiments, the system may include a second emulation chip including a user memory and an instruction memory. The first synchronization device may be configured to cause the second emulation chip to perform, during the first gap period, refreshes on the user memory of the second emulation chip.

In some embodiments, the first emulation chip may be configured to perform no memory refreshes during the first cycle and the second cycle.

In some embodiments, the first emulation chip may be configured to perform, during a second gap period including the first gap period, refreshes on the user memory of the first emulation chip. The second gap may overlap with at least one of the first cycle or the second cycle. During a period of the second gap overlapping with the at least one of the first cycle or the second cycle, the execution processor of the first emulation chip may be configured not to execute a memory access instruction.

In some embodiments, the first emulation chip further may include a trace controller including a first-in first-out (FIFO) queue. The trace controller may be configured to receive, at the FIFO queue, an output of the execution processor to generate a trace from an output of the FIFO queue. The trace controller may be configured to determine whether at least a predetermined percentage of the FIFO queue is full. The trace controller may be configured to, in response to determination that at least the predetermined percentage of the FIFO queue is full, cause the first synchronization device to stop issuing to the first emulation chip a signal indicating a start of a cycle. The system may further include a second emulation chip. In response to determination that at least the predetermined percentage of the FIFO queue is full, the trace controller of the first emulation chip may be configured to cause the first synchronization device to stop issuing to the second emulation chip a signal indicating a start of a cycle.

In some embodiments, the system may further include a second synchronization device. In response to determination that at least the predetermined percentage of the FIFO queue of the first emulation chip is full, the second synchronization device may be configured to stop issuing a signal indicating a start of a cycle.

In some embodiments, in an emulation system including a first emulation chip and a first synchronization device, the first emulation chip including an execution processor, a trace controller, a user memory and an instruction memory configured to store one or more instructions, a method of refreshing memories may include receiving, at a first-in first-out (FIFO) queue of the trace controller, an output of the execution processor to generate a trace from an output of the FIFO queue. The trace controller may determine whether at least a predetermined percentage of the FIFO queue is full. In response to determination that at least the predetermined percentage of the FIFO queue is full, the trace controller may cause the first synchronization device to stop issuing to the first emulation chip a signal indicating a start of a cycle during which a set of one or more execution instructions stored in the instruction memory are executed. The first synchronization device may interpose a first inter-cycle gap period during which no instructions from the set of one or more execution instructions are executed. The first synchronization device may cause, during the first inter-cycle gap period, the first emulation chip to perform refreshes on the user memory of the first emulation chip.

In some embodiments, the emulation system may further include a second emulation chip including a user memory and an instruction memory. In response to determination that at least the predetermined percentage of the FIFO queue of the first emulation chip is full, the trace controller may cause the first synchronization device to stop issuing to the second emulation chip a signal indicating a start of a cycle during which the set of one or more execution instructions are executed. The first synchronization device may cause, during the first inter-cycle gap period, the second emulation chip, to perform refreshes on the user memory of the second emulation chip.

In some embodiments, the emulation system may further include a second synchronization device. In response to determination that the FIFO queue of the first emulation chip is full, the trace controller may cause the second synchronization device to stop issuing a signal indicating a start of a cycle during which the set of one or more execution instructions are executed. In this manner, all the chips can execute instructions at the same time. This means that when backpressure occurs for any chip, the synchronization subsystem can cause all the chips to be held off from starting the next cycle.

First, embodiments in the present disclosure can provide useful techniques for performing improved synchronization operations of an emulation system for performing refreshes and backpressure management. Refresh control may be moved out of emulation chip and into a synchronization subsystem (e.g., a synchronization device), thereby the synchronization subsystem can be aware of backpressure and control when to step (e.g., generate steps) for each emulation chip. The synchronization subsystem may be aware when refreshes are issued, and the synchronization subsystem thus can stop issuing further instructions to wait until refresh completes.

Second, embodiments in the present disclosure can provide useful techniques for efficiently performing refreshes. In some embodiments, refreshes may be issued or performed during an inter-cycle gap between consecutive emulation cycles. In some embodiments, refreshes may be issued or performed in a duration that overlaps with a major cycle such that in the overlapping duration no memory access is performed, thereby providing flexibility in issuing or performing refreshes. The issuing or performing of refreshes during an inter-cycle gap or in a duration overlapping with a major cycle can be done in a way that is adjusted for each chip to minimize the inter-cycle gap size or minimize extra time required in the inter-cycle gap. Performing refreshes during an inter-cycle gap (inter-cycle refreshes) can be more efficient than performing statistically scheduled refreshes during a major cycle (intra-cycle refreshes), because in the intra-cycle refreshes, refreshes are statically scheduled in all emulation chips so if a refresh is in any cycle of an emulation chip, the refresh penalizes corresponding cycles of all the other emulation chips. In some embodiments, a synchronization device may determine, based on a schedule (scheduled by a compiler) in a cycle, whether refreshes can be overlapped with a portion of the cycle that does not contain a memory access (otherwise there would be a collision). If it is determined that refreshes can be overlapped with the portion, the synchronization device can perform refreshes during the overlapped portion and intra-cycle gap. If it is determined that the overlapped portion is not of sufficient size to completely contain the refreshes, then the synchronization device may extend the gap just enough to cover the refreshes. Additionally, this scenario would occur only enough to meet the DRAM refresh requirement (generally, some fraction of all cycles).

FIG. 1A is a block diagram depicting components of an emulation system 100, according to some embodiments. The emulation system 100 includes a host system 102 communicatively coupled to an emulation device 104 via a communication link 150. The communication link 150 includes any type of computing networking hardware and software components establishing a bus or link between the devices 102, 104, and allowing for the transfer of data and control signals between the host system 102 and the emulation device 104. In some embodiments, the emulation device 104 may include one or more racks 106-1 to 106-M (M≥1) and a synchronization subsystem 108, which will be described below in detail with reference to FIG. 1B, FIG. 2 and FIG. 3.

The host system 102 may be any computing device that includes a processor 114, a memory 116, various support circuits 118, and one or more I/O interfaces 120. A processor 114 of the host system 102 may include circuitry configured to execute the various processes and tasks described herein. Non-limiting examples of a processor 114 of the host system 102 may include, but are not limited to, an x86 processor, an ARM processor, a Reduced Instruction Set Computing (RISC) processor, an Application-Specific Integrated Circuit (ASIC) processor, or a Complex Instruction Set Computing (CISC) processor.

Memory 116 of the host system 102 may store various forms of software and files, such as an operating system (OS) and emulation support software 124, such as a compiler module 122 and/or a configuration manager 126. Some of the commonly known memory 116 implementations may include, but are not limited to, a random access memory (RAM), a read only memory (ROM), a hard disk drive (HDD), a secure digital (SD) card, a magneto-resistive read/write memory, an optical read/write memory, a cache memory, or a magnetic read/write memory. Support circuits 118 of the host system 102 may include conventional cache memory, power supply, clock circuits, data registers, I/O interfaces 120, and the like. An I/O interface 120 may be directly coupled to the memory 116 or coupled through the processor 114, and may be configured for communication with the emulation device 104 via the communication link 150. An I/O interface 120 may also be configured to receive inputs from user interface devices (e.g., keyboard, mouse) and to generate an interactive graphical user interface (GUI) to output on a monitor an interactive display configured to receive user inputs form the various interface devices.

A compiler module 122 may be software configured to convert a hardware design netlist file, e.g., hardware described in a VHSIC hardware description language, to a sequence of instructions that can be evaluated by a hardware emulator executed by an emulation device 104. The compiler 122 may be executed on any number of devices, such as the host system 102 or emulation device 104 shown in FIG. 1A, or another device not shown in FIG. 1A. The compiler module 122 may be a software module component of design or emulation software 124, which may be executed by the host system 102 or emulation device 104; or the compiler module 122 may be a standalone software application configured to compile a design file, such as a netlist file. In operation, the compiler module 122 may be configured to receive and compile a netlist design file containing design elements, such as the logic gates, of an integrated circuit currently being designed. The compiler module 122 may then generate a virtual logic file based on the compiled netlist. The compiler 122 "maps" the integrated circuit's logic and timing of operations, according to the design of the integrated circuit, into the hardware components of the emulation system 100, such as processors. The compiler may then generate instructions for the components of the emulation system 100 that, when executed by the components of the system 100, cause the emulation system 100 to function as the integrated circuit being designed and emulated.

The compiler module 122 may include a partitioner component and a scheduler component, though it should be appreciated that the compiler 122 may be segmented into any number of discrete component software modules. In an opening import phase, the compiler 122 receives a netlist and then begins compiling the netlist. Here, the compiler 122 may parse the logic gates of the netlist into a database format. A partitioner may determine which part of the netlist is going to be executed by which hardware resource of the emulation system 100. Then, a scheduler may determine which of the hardware resources should execute the resulting instructions generated for each particular part of the netlist. The scheduler may also determine when in the execution lifecycle the netlist should be executed.

The emulation software 124 may be a software module, which may be executed by the host system 102, and is configured to track the status and control the performed of components of the emulation system 100. The emulation software 124 may determine which components of the emulation system 100 are available or unavailable to receive parts of the virtual logic generated by the compiler 122. In some cases, the emulation software 124 continuously polls or self-tests the emulation system 100 for faulty hardware components. In some cases, the emulation software 124 may determine the status of components of the emulation system 100 when the virtual logic is being loaded into the hardware components of the emulation system 100.

A configuration manager 126 may be a component software module of the emulation software 124 executed by the host system 102 or the emulation device 104. The configuration manager 126 may be configured to track the status of compiled instructions and may control the execution of instructions by components of the system 100. The configuration manager 126 may determine which components of the system 100 are available or unavailable to receive parts of the virtual logic generated by the compiler 122. In some cases, the configuration manager 126 continuously polls or self-tests the emulation system 100 for faulty hardware components, and may track the availability of various components of the system 100.

In some cases, the various software modules 122, 124, 126 may be executed in whole or in part on a host system 102, such as an administrator or user computer, configured to communicate data associated with the respective software module to and from the emulation device 104. For example, in some cases, the host system 102 may execute a compiler 122 module that allows a user to input a netlist design file, containing logic gate designs of the prototype ASIC, and then compiles the netlist file. The resulting virtual logic generated by the host system 102 may then be transmitted or otherwise downloaded to an emulation device 104. In this example, the emulation device 104 may execute the configuration manager module 126 that tracks the availability of resources within the emulation system 100.

An emulation device 104 of the emulation system 100 may include an emulation engine (not shown) configured to be a programmable device used in the verification of hardware design of an integrated circuit currently being designed and tested. The emulation engine may test and verify the operation of an integrated circuit, an entire board of integrated circuits, or an entire system, without having to actually, physically fabricate the hardware. The emulation engine generally includes an emulation board. The emulation board includes emulation circuits. The emulation circuit includes several emulation processors. The emulation processor is capable of mimicking a logic gate. The emulation device 104 may further include any type of emulation platform. For example, the emulation device 104 may include one or more programmable logic devices (PLDs), such as field programmable gate arrays (FPGAs) to perform the emulation. In one embodiment, the FPGA may be incorporated within or mounted on an expansion board, for example, a personal computer expansion board such as a Peripheral Component Interconnect (PCI) board.

The emulation system 100 may further include an instructional database (not shown) and a resource index database (not shown). The instruction database may store records of virtual logic or instruction sets compiled by a compiler from netlist files. The instruction database may be hosted in non-transitory machine-readable storage medium of any computing device capable of hosting the instruction database and performing the various tasks and processes associated with the instruction database, as described herein. The instruction database may receive, from a device executing the compiler, instructions compiled from the netlist file of an integrated circuit being tested. In some cases, the instructions may be contained within a virtual logic file generated by the compiler. At download time, the hardware components of the emulation system 100, such as the instruction memories of processors, are loaded with the compiled instructions.

Figure 1B:
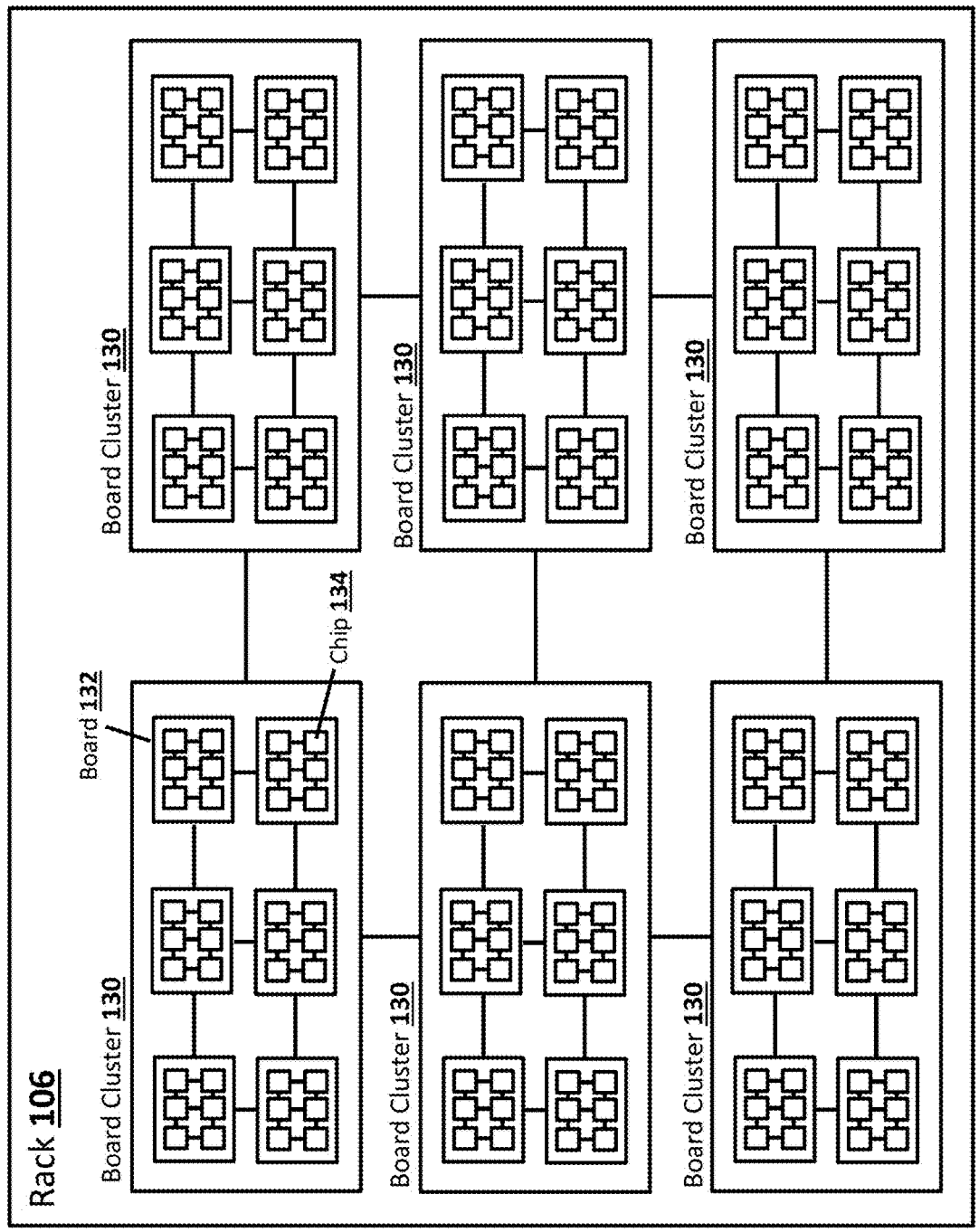
FIG. 1B is a schematic diagram showing a hierarchical configuration of components in an emulation system, according to some embodiments.

FIG. 1B is a schematic diagram showing a hierarchical configuration of components in an emulation system, according to some embodiments. FIG. 1B shows a rack 106 (which may correspond to one of racks 106-1 to 106-M in FIG. 1A) that may be housed within one or more emulation devices 104, according to an embodiment. The emulation system 100 (see FIG. 1A) may include one or more racks 106 that may physically house components of the emulation system 100, logic board clusters 130, logic boards 132, emulation chips 134, and one or more types of data or signal buses configured to carry data signals between the various components of the emulation system 100. Although the various systems and methods disclosed herein are exemplified in emulation systems 100, such systems and methods may be embodied in any number of other computing systems or other type of circuit-driven electrical systems.

Board clusters 130 may be logical and/or physical collectives of one or more logic boards 132. Logic boards 132 may be clustered for any number of reasons, such as creating proximity among a set of boards 132 for more efficient signal transfer and processing between the boards 132 of the cluster 130. Clustering logic boards 132 is often a design consideration, and, as such, other embodiments may cluster and/or disaggregate logic boards 132 according to any number of different organizational patterns. As shown in FIG. 1B, the rack 106 includes six board clusters 130; each of the board clusters 130 includes six logic boards 132. The board clusters 130 may be interconnected with one another by buses, which may carry data signals transmitted to and from the board clusters 130. Likewise, buses may interconnect the logic boards 132 within a particular logic board cluster 130, so that the logic boards 132 may transmit and receive data signals to and from other logic boards 132 within the same logic board cluster 130.

Emulation logic boards 132 may include computing hardware components capable of emulation functionality to emulate the design and functions of an ASIC or other circuitry; non-limiting examples of emulated ASICs might include CPUs, GPUs, and ALUs, among others. The logic board 132 may include one or more emulation chips 134 performing the functions needed for emulation, and one or more buses interconnecting the emulation chips 134. The buses may be an optical, copper, or any other conductive material capable of carrying data signals. In operation, the buses may carry data signals transmitted to and from the emulation chips 134 of the logic board 132. In some cases, the logic board 132 may include one or more buses supporting communication between emulation chips 134 on the same logic board 132 (e.g., intra-board communication); and, in some cases, the logic board 132 may include one or more buses supporting communication between emulation chips 134 located on other logic boards 132 of the system 100 (e.g., inter-board communication).

Emulation chips 134 may include any number of processors capable of performing the various tasks and processes for emulating logic systems (e.g., ASIC, FPGA) being designed; multiplexers configured to direct data signals to and from the processors; buses for communicating data between the processors; and data lanes 210 connecting the components of processors. Components of emulation chips 134 will be described below in detail with reference to FIG. 2 (see emulation chip 200 in FIG. 2). An emulator chip 134 may be programmatically configured to mimic the functionality of logic systems being designed. The emulator chip 134 may be configured according to programmable logic that configures the emulator chip 134 to mimic the particular behavior of the logic system being tested, based on the logic system's current netlist design. In this way, circuitry designers may prototype new logic system designs using processor-based emulation, before actually manufacturing the logic system. In operation, components of the emulation chips 134 may receive sets of instructions from a compiler module 122, which may compile a netlist design file representing the logic system's circuit design. The result of compiling the netlist generates virtual logic including the instruction sets for the various components (e.g., processors, multiplexers) of the emulation chips 134.

The emulation chips 134 may further include or otherwise be coupled to an emulator controller or an emulator control module (ECM) that controls operations of the emulation chips 134. The ECM may include software or firmware instructions configured to supervise the hardware emulation of the components of the system 100, such instructing components of the emulation chips 134 to start and stop an emulation procedure in a synchronized manner, coordinate timestep emulation, monitor the state of the emulation chips 134, among other administrative controls. Thus, the various the emulation chips 134 may be configured to coordinate the emulation of the logic system design.

In some embodiments, the processors of the emulator chip 134 may be organized into any number of processor clusters (not shown) to efficiently share data inputs, data outputs, and data references (e.g., calls to stored data in a data array). For example, multiple processors of an emulator chip 134 may be clustered together such that the processors reference the same data array and/or instruction store. Due to the modular nature of the components of the system 200, components like the processors may be organized into any number of additional or alternative organizational patterns. In some cases, clusters of processors may be clustered into clusters of clusters. In some embodiments, however, organizational patterns are not required, and thus, in some embodiments, processors of an emulations chip 134 may not be organized into clusters at all.

Figure 2:
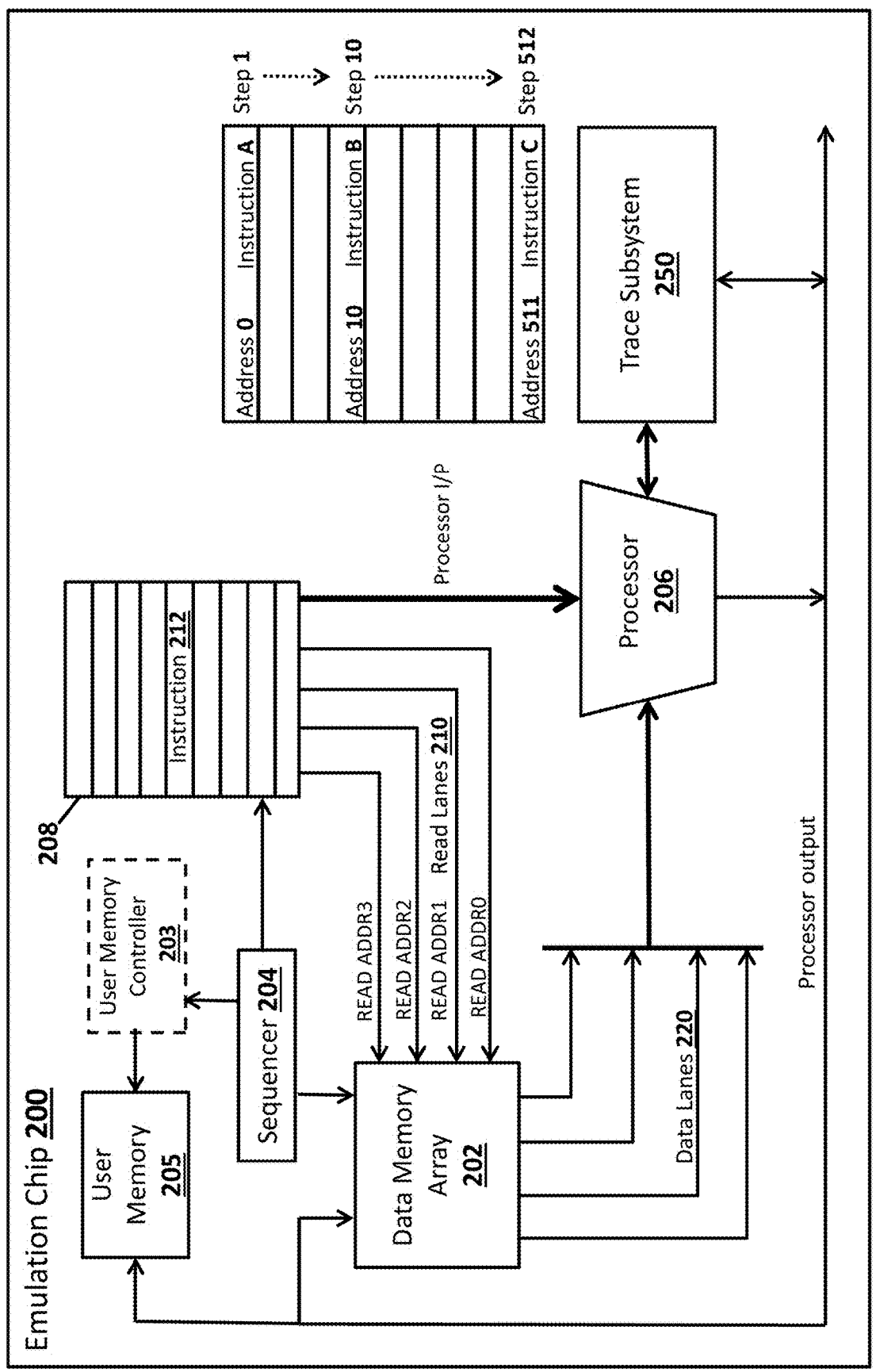
FIG. 2 is a block diagram that shows components within an emulation chip of an emulation system, according to some embodiments.

FIG. 2 shows components within an emulation chip 200 of an emulation system, according to some embodiments. Emulation chips disclosed herein may be capable of performing programmatic logic functions used for hardware-based (e.g., processor-based) logic system emulation, which may allow for prototyping ASICs, or other forms of circuitry, before actual production of the logic systems. During execution of an emulation procedure, the programmatic logic representing a logic system's behavior and design may be executed by the various processors of emulation chips within the emulation system.

The emulation chip 200 may include a data memory array 202, a sequencer 204, one or more processors 206, an instruction memory 208, and signal lanes 210 connecting the components to one another and to external components of the emulation system. For simplicity, only one emulation processor 206 is shown. However, in some embodiments, several emulation processors 206 may be grouped together into a cluster of processors 206 on the chip to enable the cluster of processors 206 to more efficiently evaluate a large amount of input data in a single emulation step. In such embodiments, a single sequencer 204 and an instruction memory 208 may be coupled to the plurality of the processors 206 or processor clusters. Nearly any number of processors 206 may be used to form a cluster; however, in some cases, the number may be limited by the amount of processing that can occur within a cycle. For simplicity, the following disclosure describes the operation of an emulation system in the context of an emulation chip. However, in some embodiments, the same concepts can apply to an emulation cluster of N-processors or N-processor clusters, where N is an integer greater than or equal to one.

A processor 206 of the emulation chip 200 may be associated with a data memory array 202. In some cases, the data memory array 202 may be a component of the processor 206. In some cases, the data memory array 202 may be communicatively coupled to a plurality of processors 206, such that the data memory array 202 is accessible by a cluster of processors 206. The data memory array 202 is a memory circuit that stores outputs of processors 206 of the emulation chip, as well as data from other external processors. In some embodiments, the data memory array 202 may be SRAM.

An instruction memory 208 may be configured to store instructions to be executed by a processor 206. In some embodiments, the instruction memory 208 may be static random-access memory (SRAM). In many cases, the instructions may instruct the processor 206 on which functions should be executed in which cycle. The instructions may provide inputs for evaluation by the processor 206, or the instructions may indicate which inputs to accept from the data memory array 202 or external sources. The instructions may also indicate the destination for processor 206, such as another processor of the system or a storage location in the data memory array 202. By varying the values received from the data inputs, the processor 206 may emulate any Boolean function requiring two bits. Likewise, the size of the Boolean functions that can be emulated using lookup tables (LUTs) can be increased or decreased by adding or removing the number of select inputs fed into the LUTs. For example, in some embodiments, processors 206 of the emulation chip may include LUTs with four inputs ("LUT4"), which allows each of these processors 206 to perform any four-bit Boolean function. In some embodiments, however, there is no limitation upon the number of select inputs that are associated with the LUTs of the emulation chip.

The sequencer 204 may be connected to the data memory array 202 and the instruction memory 208. The sequencer 204 provides timing information to the emulation chip. The sequencer 204 may be further configured to provide read addresses to the instruction memory 208 so as to read data via read lanes 210 using the read addresses, and provide sequential write addresses to the data memory array 202 so as to write data via write lanes 220 using the write addresses. The sequencer 204 may be configured to receive a design step (DSTEP) signal (or simply "step signals" hereinafter), and on receiving the design step (DSTEP) signal, the sequencer 204 may start at an internal counter beginning from an initial value and increment to a maximal value. Each increment of the sequencer 204, which is equivalent to an emulation step, may cause the step value to advance from zero towards the maximal value. All of the emulation steps may form one emulation cycle of the emulation system. The emulation cycle may be completed once the sequencer 304 reaches a maximal value. Upon reaching a maximal value, the sequencer 204 begins counting again from an initial value and a new emulation cycle in the emulation system may be then initiated.

In an embodiment, the memories of the emulation system may be refreshed. For example, a user memory 205 may be DRAM that requires refreshes. The user memory 205 may include memories for modeling memories of the design under test. In some embodiments, the sequencer 204 may send commands to a user memory controller (UMC) 203 regarding when to refresh the memories of the emulation chip 200. In some embodiments, a synchronization device external to the emulation chip (e.g., synchronization device of the synchronization subsystem 108; see FIG. 1 and FIG. 3A) may send commands to the emulation chip or a UMC thereof regarding when to refresh the memories of the emulation chip 200. In some embodiments, the memories of the emulation system may require a pre-determined rate of refreshes. Thus, when the emulation cycle is being executed in the emulation system, the sequencer 204 or an external synchronization device may monitor a length of the emulation cycle and when the emulation cycle reaches a pre-determined level, the sequencer 204 or the external synchronization device may send commands for the refreshing of the memory, causing a gap in or outside the emulation cycles. Methods and systems for scheduling and performing refreshes according to some embodiments will be described below in detail with reference to FIG. 3A to FIG. 5C.

As previously described, a set of instructions may control the operation of a respective processor 206. A single instruction, sometimes referred to as an "instruction word" or "control store word" (CSW), stored in the instruction memory 208 may control the operation of the processor 206. The sequencer 204 may control operation of the data memory array 202, processors 206 and instruction memory 208 by managing the sequential execution of instruction addresses. In other words, the instruction memory 208 may store instruction words that are sequentially and repetitively provided to their respective processors 206 under the control of the sequencer 204. Each increment of the sequencer 204 may cause the system step value to increment by one step, advancing from zero to a predetermined maximum value. For example, as shown in FIG. 2, the sequencer 204 may increment from Step 1 to Step 512 to sequentially and/or repetitively provide instructions at Address 0 to Address 511 to the processor 206.

In some embodiments, Boolean processors of emulation chips, e.g., processors 206, may operate in lockstep. In some embodiments, in an execution mode, all the processors in all the emulation chips in the emulation system which are allocated to particular job may execute the same instruction index according to their local control store words (CSWs). The compiler (e.g., compiler 122 in FIG. 1A) may determine and place instructions in the available slots (steps) in the instruction memory 208, taking into account data dependencies, transmission delays, etc., such that the program as a whole accomplishes the execution of a model equivalent to one cycle of the user's design under test (DUT).

An instruction memory 208 may be a non-transitory machine-readable storage media configured store a set of instructions 212 for the processor to use for performing emulation functions and the associated facilities, including the instructions for the data memory array 202. The instruction memory 208 may be communicatively coupled to the sequencer 204, the processors, and the data memory array 202. The emulation process may begin by writing an emulation program into the instruction memory 208 that controls the processors during emulation when the emulation system runs the emulation program (stepping), and the processors and associated facilities (e.g., data memory array 202) execute the instructions.

The emulation chip 200 may include a trace subsystem 250, which can collect signals while executing the DUT, in concert with the compiler and runtime or offline debug codes. Components of trace subsystem will be described below in detail with reference to FIG. 6.

Figure 3A:
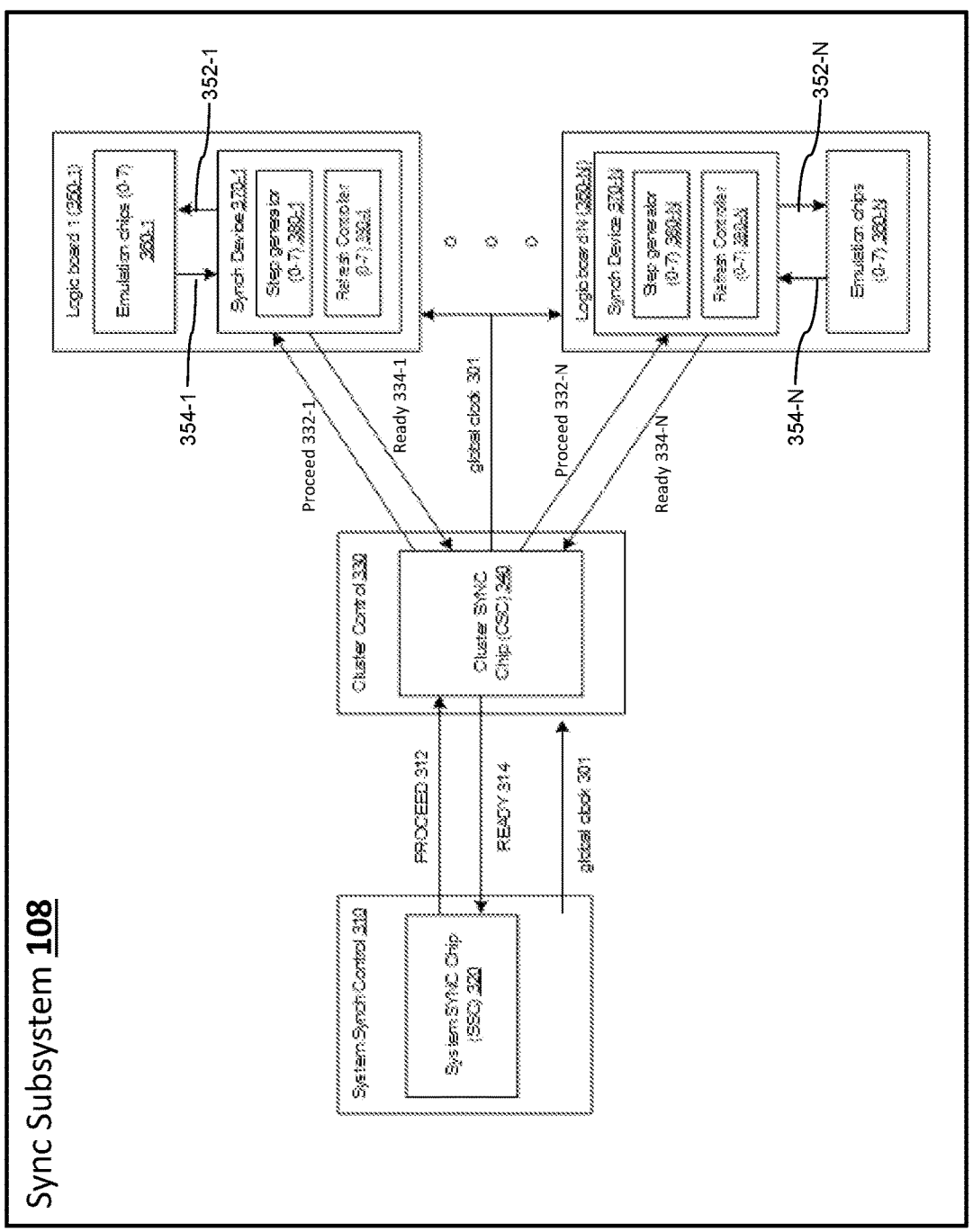
FIG. 3A is a block diagram depicting components of a synchronization subsystem in an emulation system, according to some embodiments.

FIG. 3A is a block diagram depicting components of a synchronization subsystem 108 in an emulation system, according to some embodiments.

Each emulation chip may provide a logic resource for emulation jobs running on the emulation system 100 (see FIG. 1A). The emulation chips that are assigned to the same emulation job may need to run synchronously whether the emulation chips are on a single board or multiple boards. The synchronization subsystem 108 may provide synchronization functions to run the emulation chips synchronously.

The synchronization subsystem may implement a tree structure to apply synchronization functions at different levels, for example, at a system level (e.g., at the level of the emulation system 100 in FIG. 1A) or at a cluster level (e.g., at the level of clusters 130 in FIG. 1B) or at a logic board level (e.g., at the level of boards 132 in FIG. 1B). The synchronization subsystem may include (1) a system synchronization control module 310 which applies a synchronization function at a system level, (2) a cluster synchronization control module 330 which applies a synchronization function at a cluster level, and (3) a plurality of synchronization devices 370-1 to 370-N (N≥1) which apply synchronization functions at a logic board level. The system synchronization control module 310 may include a system synchronization chip (SSC) 320 and software or firmware instructions configured to supervise the SSC 320. The cluster synchronization control module 330 may include a cluster synchronization chip (CSC) 340 and software or firmware instructions configured to supervise the CSC 340. A common or global clock signal 301 may be distributed to each of the synchronization control modules 310, 330 and the synchronization devices 370-1 to 370-N. The global clock signal 301 may be a low-skew global clock.

Using a tree structure of synchronization control modules, the synchronization functions can be cascaded to form a network tree of synchronization lines that ultimately synchronizes all of the clusters in the system. For example, CSC 340 may receive PROCEED (or GO) signals 312 from SSC 320 and drive or forward the PROCEED signals 332-1 to 332-N to the synchronization devices 370-1 to 370-N, respectively. Upon receiving the PROCEED signal 312, CSC 340 may coordinate corresponding logic boards in the same cluster so that the logic boards in the same cluster can operate in synchronization with each other. Upon receiving the PROCEED signals 332-1 to 332-N, each synchronization device on a corresponding logic board may coordinate emulation chips on the corresponding board and serve to relay and combine signals to/from the emulation chips so that the emulation chips on the same board can operate in synchronization with each other. For example, upon receiving the PROCEED signal 332-1, the synchronization device 370-1 on the logic board 350-1 may send signals 354-1 to, or receive signals 352-1 from, eight emulation chips 360-1 on the same logic board. Similarly, upon receiving the PROCEED signal 332-N, the synchronization device 370-N on the logic board 350-N may send signals 354-N to, or receive signals 352-N from, eight emulation chips 360-N on the same logic board.

Each downstream device (e.g., synchronization devices or CSC) may send READY signal to an upstream device thereof (e.g., CSC or SSC), thereby indicating the downstream device is ready to proceed or operate in synchronization with the upstream device. For example, each synchronization device 370-1, . . . , 370-N sends READY signal 334-1, . . . , 334-N to CSC 340, indicating that the synchronization device is ready to proceed or operate in synchronization with CSC 340. Similarly, CSC 340 sends READY signal 314 to SSC 320, indicating that CSC 340 is ready to proceed or operate in synchronization with SSC 320. The upstream device may collect the READY signals from the downstream device(s) and generate PROCEED signal(s) using a software programmable logic, for example. Then, the PROCEED signal may be sent to all the downstream devices. The PROCEED signal may need to be synchronized and received by all of the downstream device at the same time, while the READY signals may not need to be synchronized. The upstream device may collect the READY signals sent from corresponding downstream device(s), and once the last READY signal is received, then the upstream device generate PROCEED signal(s) sent the PROCEED signal(s) in matched phase to all downstream devices.

Each synchronization device (e.g., one of 370-1 to 370-N in FIG. 3A) may include a step generator (e.g., one of 380-1 to 380-N in FIG. 3A) and a refresh controller (e.g., one of 390-1 to 390-N in FIG. 3A) to manage synchronization among the emulation chips on the same logic board (e.g., one of 360-1 to 360-N in FIG. 3A). In some embodiments, the refresh controller may generate a refresh signal instructing an emulation chip on the same logic board to perform refreshes on memories of that emulation chip. More details about the step generator and refresh controller will be described below with reference to FIG. 3B to FIG. 5C. In some embodiments, the signals 352-1 to 352-N sent from each synchronization device to corresponding emulation chips may include (1) step signals generated by the step generator of that synchronization device and/or (2) refresh signals generated by the refresh controller of that synchronization device. In some embodiments, the signals 354-1 to 354-N sent from emulation chips on the same board to the corresponding synchronization device may include (1) breakpoint signals generated by emulation chips to stop generating step signals and/or (2) synchronization output (SYNCO) signals generated by emulation chips to indicate that emulation chips are ready to operate in synchronization with the synchronization device. In some embodiments, each synchronization device may send READY signal to CSC when it receives and asserts all relevant SYNCO signals from all the emulation chips on the same board. Each synchronization device may send step signals to emulation chips on the same board when it receives PROCEED signal issued from CSC 340.

Figure 3B:
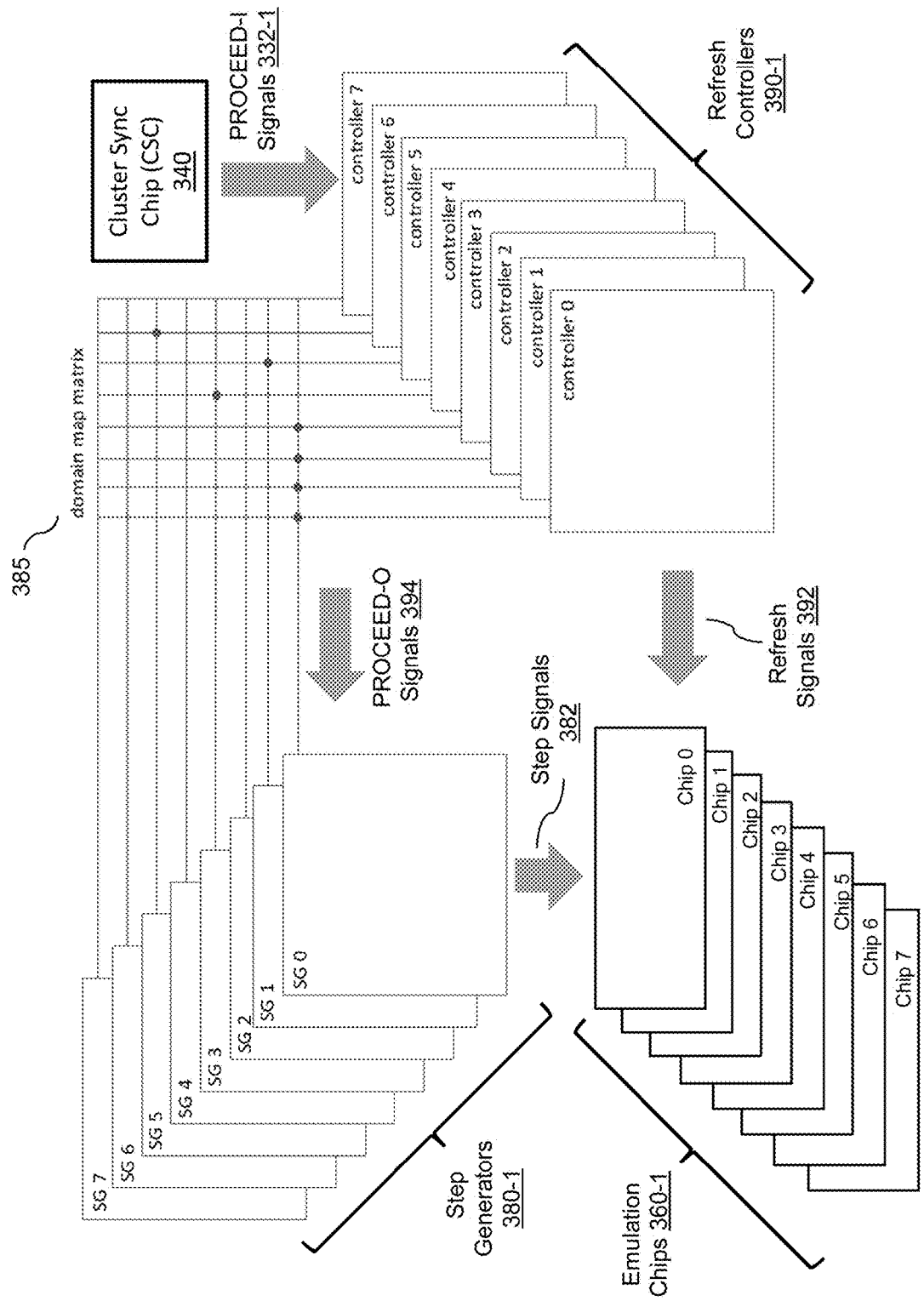
FIG. 3B is a schematic diagram showing signals communicated between components of a synchronization subsystem and emulation chips in an emulation system, according to some embodiments.

FIG. 3B is a schematic diagram showing signals communicated between components of a synchronization subsystem and emulation chips in an emulation system, according to some embodiments. In some embodiments, as shown in FIG. 3B, a synchronization device (e.g., synchronization device 370-1 in FIG. 3A) may include a plurality of step generators (e.g., eight step generators 380-1) and a plurality of refresh controllers (e.g., eight refresh controllers 390-1), to communication with a plurality of emulation chips on the same board (e.g., eight emulation chips 360-1). For example, eight step generators 380-1 may independently drive corresponding eight emulation chips 360-1 by sending step signals 382 to the emulation chips. Similarly, eight refresh controllers 390-1 may independently control memory refreshes of corresponding eight emulation chips 360-1 by sending refresh signals 392 to the emulation chips. In some embodiments, the refresh controllers 390-1 may receive PROCEED signals 332-1 issued from CSC 340 (hereinafter "PROCEED-I") and send PROCEED signals 394 (hereinafter "PROCEED-O") to the step generators 380-1.

A synchronization device on a logic board may include a series of domain mapping registers (not shown) which control the association between its step generators and emulation chips on the same logic board. Similarly, a synchronization device on a logic board may include a domain mapping matrix 385 (e.g., matrix as data stored in a memory of the synchronization device) which defines association between its refresh controllers and its step generators. The association between step generators and refresh controllers may be the same as or consistent with the association between the step generators and the emulation chips on the same logic board.

Figure 4:
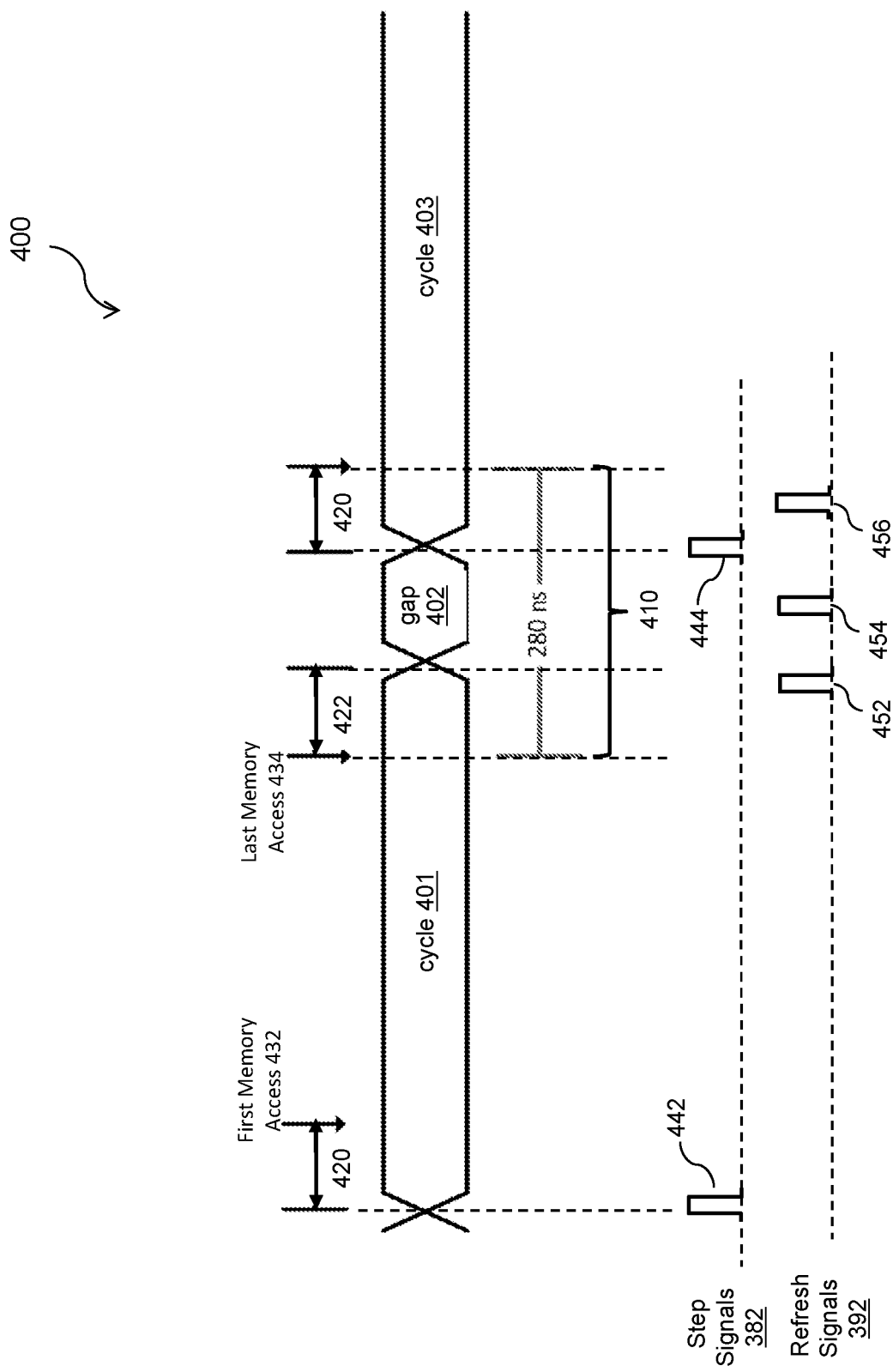
FIG. 4 is a schematic diagram showing an illustrative schedule including emulation cycles and an inter-cycle gap, generated by a synchronization device in an emulation system, according to some embodiments.

FIG. 4 is a schematic diagram showing a schedule including emulation cycles and an inter-cycle gap, generated by a synchronization device in an emulation system, according to some embodiments.

Referring to FIG. 4, a step generator and a refresh controller of a synchronization device (e.g., a step generator 380-1 and a refresh controller 390-1) may send step signals (e.g., step signals 382) and refresh signals (e.g., refresh signals 392) to an emulation chip (e.g., an emulation chip 360-1) to define a schedule 400 of that emulation chip. The schedule 400 includes (1) emulation cycles 401, 403 during which a set of instructions are executed by a processor of the emulation chip 360-1 and (2) an inter-cycle gap 402 during which refresh may be performed by a sequencer or a user memory controller (UMC) of the emulation chip 360-1 (e.g., sequencer 204 and UMC 203 in FIG. 2). In some embodiments, the step generator may define the emulation cycles 401, 403 by sending step signals 442 to the emulation chip, and the refresh controller may send refresh signals 452, 454, 458 to the emulation chip to cause the emulation chip to perform refreshes the memory thereof.

A refresh controller may cause an emulation chip to perform inter-cycle refreshes that are delivered during periods in which there is no stepping (e.g., a period in which no steps are scheduled). In some embodiments, such non-stepping periods may occur due to break points, or gaps due to flow control on the synchronization subsystem (e.g., flow control on a tree-structure synchronization), or before the design has started stepping for the first time, for example. Referring to FIG. 4, the refresh controller may issue or perform inter-cycle refreshes (or inter-cycle gap refreshes) using the refresh signal 454 for the inter-cycle gap 402 which is a non-stepping period between consecutive emulation cycles 401, 403. The inter-cycle gap 402 may be defined such that if an inter-cycle refresh signal (e.g., refresh signal 454) is issued, the step generator may issue a delayed step signal (e.g., step signal 444) delayed by a programmable amount of time, to make the inter-cycle gap 402 a non-stepping period. In some embodiments, the programmable amount time may be derived from a static schedule (e.g., a predetermined duration of an emulation cycle, a predetermined duration of an inter-cycle gap, etc.).

In some embodiments, a refresh controller may cause an emulation chip to perform intra-cycle refreshes that are delivered at a programmable position within an emulation cycle (e.g., a position measured in global clocks from a step signal generated by a step generator). Referring to FIG. 4, a step for the first memory access 432 during the emulation cycle 401 or 403 may define overlapping durations 420 each overlapping with a portion of the beginning of the emulation cycle 401 or 403 for which there are no memory accesses. Similarly, a step for the last memory access 432 during the emulation cycle 401 may define an overlapping duration 422 overlapping with a portion of the end of the emulation cycle 401 for which there are no memory accesses. The refresh controller may issue or perform intra-cycle refreshes (e.g., using refresh signals 452 and 456) for the overlapping durations 420 or the overlapping duration 422 for which there are no memory accesses. In this manner, the size of the inserted inter-cycle gap 402 can be minimized (and therefore cycles can be run at a higher rate) by overlapping the refreshes with the memory access-free durations.

For example, if cycle frequency is 1 MHz (e.g., the duration of each cycle is 1 μs), refreshes may be performed every four cycle, taking up 280 ns, which is 28% of single cycle duration, but only 7% if issued every fourth cycle. Using a combination of inter-cycle refreshes and intra-cycle refreshes as shown in FIG. 4, refreshes may be performed during a non-stepping, memory access-free period 410, whose duration can be set to 280 ns, thereby performing refreshes during a single emulation cycle instead of performing refreshes every four cycles. In this manner, refreshes can be performed as frequent as every cycle (during an inter-cycle gap), if necessary. In other words, a refresh duration 410 placed in an inter-cycle gap 402 can be overlapped with a cycle duration, such that during the overlapped duration (e.g., the overlapped duration 420 or 422 in FIG. 4) no memory access can be performed, thereby providing flexibility in issuing or performing refreshes even during a major cycle (e.g., cycle 401, 403 in FIG. 4) in which instructions are executed. In some embodiments, refreshes may be issued or performed during an inter-cycle gap (e.g., the inter-cycle gap 402) or in a duration overlapping a major cycle (e.g., the duration 420 or 422) in a way that is adjusted for each chip to minimize the size of the gap or minimize extra time required in the gap. If, based on the size of the intervals 420 and 422, the overlap can be maximized, then no additional time is required for refresh, and the performance of the system is not impacted at all by the need to issue refreshes.

In some embodiments, for a given job, the emulation system can have many emulation chips and their corresponding refresh controllers scattered across different clusters and racks. In the same way that the stepping of these chips is synchronized, the refresh controllers may be synchronized. If the refresh controllers were not synchronized, the refresh controllers could issue refreshes (and therefore, gap extensions) in different cycles, and the step generators would quickly become out of synchronization. If the step generators were desynchronized, then different chips in the system would execute instructions at different times, and the emulation system would not function since the chips could not exchange data as required by the compiler-generated static schedule. To manage this problem, the emulation system can synchronize the refresh controllers using the synchronization tree structure as shown in FIG. 3A which is the same mechanism by which the step generators are synchronized. In some embodiments, any logic that is used in generating a decision about whether to refresh can be reset by the first rising edge of PROCEED signals (e.g., the first rising edge of PROCEED-I signals 332-1 in FIG. 3A and FIG. 3B). For example, a synchronization device may asynchronously run refresh controllers that are initialized ahead of job start, and synchronize the refresh controllers at the first rising edge of PROCEED signals (received by the refresh controllers). In this manner, all the refresh controllers can decide whether to refresh in the same way all the step generators decide whether or not to issue step signals. Refresh can occur at the same time in the coarse level among chips although each chip may change refresh time a little bit in fine level to avoid overlapping a memory access with refresh. (That is, the precise time within a gap may vary from chip to chip, but the number of refreshes issued to each chip in each gap will be the same, and all the chips will execute instructions at the same time.)

In some embodiments, there may be a delay between (1) the first rising edge of PROCEED signal received by a refresh controller (e.g., PROCEED-I signals 332-1 in FIG. 3A and FIG. 3B) and (2) the first step signal (e.g., step signals 382 in FIG. 3B) generated by a step generator. This is because some refresh controllers may be in the middle of a refresh, and if a controller is in the middle of a refresh, then the corresponding step generator is prevented from immediately issuing step signals. For this reason, the emulation system can use this opportunity to issue a refresh for any other refresh controller that does not already have a refresh in progress.

In some embodiments, a refresh controller may maintain a value of the outstanding count indicating how many refreshes the refresh controller "owes." This value may increment at a rate controlled by an average refresh duration value indicating how many global clocks between refreshes, on average, and decrement every time a synchronization device or an emulation chip issues a refresh. In some embodiments, upon entering a gap, a refresh controller may not immediately issue any outstanding refresh because the refresh could collide with a memory access that was launched near the end of a cycle. In some embodiments, refresh may be done in a scheduled time in the coarse level using outstanding count. For example, when a refresh is scheduled to occur every four cycles, every chip needs to follow the scheduled refreshes.

In some embodiments, an emulation chip or a synchronization device can perform per bank refreshes. For example, a refresh can be issued to an individual memory bank instead of the entire memory of the emulation chip. In this case, the refresh controller may need to decrement the outstanding count by a non-integer number (e.g., a fraction) in every cycle. In some embodiments, considering the case of 8 memory banks with 1 per-bank scheduled refresh per cycle, the average refresh duration value can be programmed 8 times smaller than the original average refresh duration value so that the count increases 8 times more frequently. In some embodiments, a synchronization device or refresh controllers maintain a refresh per cycle value indicating how many effective refreshes the synchronization device delivers per cycle (when intra-cycle refreshes enabled) and a chip refresh per cycle value indicating how many effective refreshes a chip delivers per cycle (when intra-cycle refreshes are disabled). In the case of per bank refreshes, the refresh per cycle value can be set to 8 so as to refresh all banks which each synchronization device refreshes) and the chip refresh per cycle value can be set to 1.

In some embodiments, a scheduler (e.g., compiler 122 in FIG. 1A) may manage intra-cycle refreshes, and a synchronization device may manage inter-cycle refreshes. The synchronization device may calculate or keep track of the total number of refreshes based on a refresh per cycle value indicating how many refreshes the scheduler issues per major cycle. The synchronization device may also determine, based on the refresh per cycle value, when new refreshes are due. In other embodiments, a synchronization device may control or manage both intra-cycle refreshes and inter-cycle refreshes.

In some embodiments, in a multiphase case where the number of steps for a major cycle can become very large, a synchronization device or an emulation chip can accumulate a deficit of refreshes before it has an opportunity to issue the refreshes. For a sufficiently large multiphase job, multiple refreshes can be delivered in an inter-cycle gap to prevent the outstanding count from growing unbounded.

In some cases, intra-cycle refreshes may arrive with a position exceeding a job step count. This scenario is legitimate and arises due to memory access rules that a memory access and a refresh should be separated by some number. For example, if a memory access occurs at step n, a refresh cannot arrive at step (n+1) because the memory access and the refresh are not separated by some number. In some cases, this separation rule may push the nominal position of the refresh outside of the cycle. In this scenario, in some embodiments, the synchronization device can extend the inter-cycle gap (as if the inter-cycle refresh is for all intra-cycle refreshes) so that the refresh can fall in this extended gap.

In some cases, inter-cycle refreshes may arrive close to an end of a cycle. As noted above, in some embodiments, when transitioning from a cycle to a gap, a refresh controller may not immediately issue any outstanding refresh because the outstanding refresh could collide with a memory access that was launched near the end of a cycle. In some embodiments, the refresh controller may issue any outstanding refresh such that a separation between this refresh and a memory access near the end of the cycle is greater than a minimum according to the memory rules.

FIG. 5A to FIG. 5C are schematic diagrams showing signals generated by a synchronization device in an emulation system, according to some embodiments. FIG. 5A illustrates an example of intra-cycle refreshes in which step signals are generated by one step generator and refresh signals 511 and 513 are issued from two refresh controllers during an emulation cycle 510 defined by the step signals.

FIG. 5B illustrates a first example of inter-cycle refreshes in which step signals generated by one step generator defines an emulation cycle 520 and an inter-cycle gap 522, and refresh signals 521 and 523 are issued from two refresh controllers during the inter-cycle gap 522. FIG. 5B also illustrates a second example of inter-cycle refreshes in which an inter-cycle gap or a non-stepping period 524 is defined by a breakpoint signal issued by an emulation chip (not shown) and refresh signals 525 and 527 are issued from the two refresh controllers during the non-stepping period 524.

FIG. 5C illustrates an example of synchronizing inter-cycle refreshes in which inter-cycle refreshes start out unsynchronized (e.g., refresh signals 530, 532), but after the first rising edge (e.g., rising edge 534) of PROCEED-I signal received by refresh controllers, all inter-cycle refreshes (e.g., refresh signal 538) will be at the same position for each emulation chip (just like step signal 526). In this manner, inter-cycle refresh signals initially out of synchronization can be at some point synchronized.

FIG. 5C also illustrates an example of performing intra-cycle refreshes by intervention of refresh controllers, where a refresh controller determines that intra-cycle refreshes (e.g., regardless of whether the intra-cycle refreshes are controlled by a synchronization device or not) are not enough to satisfy an average refresh rate requirement, and the refresh controller will de-assert PROCEED-O signal 533 to insert a gap, during which the refresh controller will issue the outstanding refreshes 535 or 537. To perform this intervention, a refresh controller may maintain a register storing a refresh threshold value indicating a threshold value of the outstanding count. In some embodiments, the refresh controller may not issue any kinds of refreshes until the outstanding count reaches the refresh threshold value. In some embodiments, when the outstanding count reaches the refresh threshold value, the synchronization device will stop issuing new cycles (e.g., the refresh controller performs intervention by de-asserting PROCEED-O signal as shown in FIG. 5C). When the count falls back below the refresh threshold value, cycles will resume.

Figure 6:
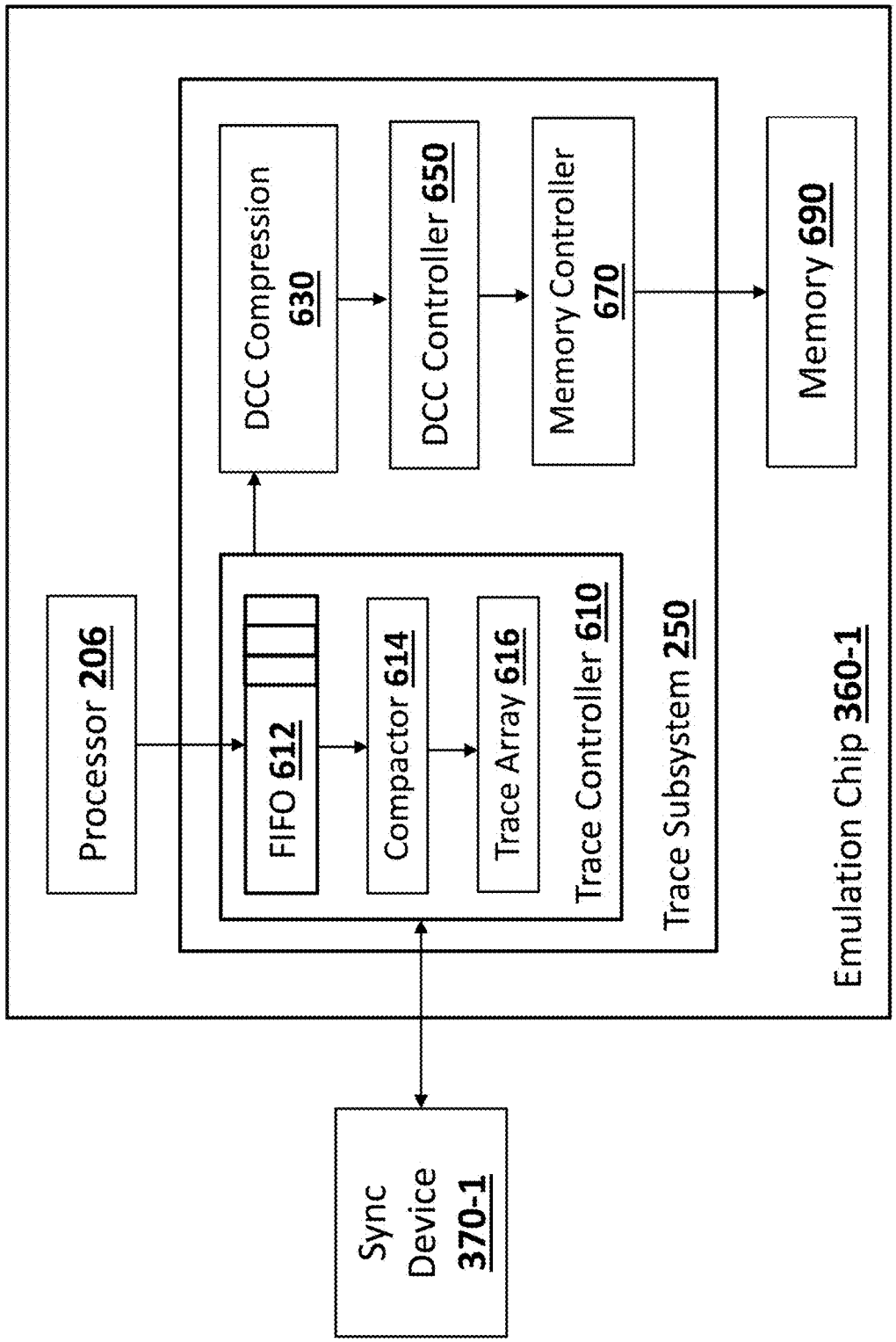
FIG. 6 is a block diagram depicting components of a trace subsystem in an emulation system, according to some embodiments.

FIG. 6 is a block diagram depicting components of a trace subsystem 250 in an emulation system, according to some embodiments. In some embodiments, the trace subsystem 250 may capture data during an emulation run so that waveforms can be displayed by the user. In some embodiments, the trace subsystem 250 may support two general modes of operation, (1) dynamic probes or (2) full reconstruction. In dynamic probing mode, the trace subsystem can collect a deep trace using a limited set of user-specified probes. In full reconstruction mode, the trace subsystem can reconstruct all user signals without user specification and/or without performance impact.

The trace subsystem 250 may include a trace controller 610, a data capture card (DCC) compression module 630, a DCC controller 650, and a memory controller 670 configured to control a memory 690 of an emulation chip (e.g. emulation chip 360-1 in FIG. 3A and FIG. 3B). The memory 690 may be a memory dedicated for data/trace collection. The memory 690 may be DDR modules, e.g., Double Data Rate Synchronous Dynamic Random-Access Memory (DDR SDRAM) modules.

The trace collector 610 may include a FIFO queue 612, a compactor or trace compactor 614, and a trace array 616. In some embodiments, the trace subsystem 250 or trace controller thereof 610 (as a backpressure module or device) may perform a backpressure management using the FIFO queue 612. The backpressure module or device may determine whether the FIFO queue becomes full and cause the emulation chip 360-1 to stop generation of emulation data when it is determined that the FIFO queue becomes full. The backpressure module or device may be aware of refresh timing by communicating with a synchronization device (e.g., synchronization device 370-1) which is handling refreshes (for each emulation chip) separately from each emulation chip. The synchronization device handling refreshes (for each chip) can be aware when it issues refreshes or a chip issues refreshes, and thus can stop issuing further instructions to each chip to wait until refresh completes or the FIFO queue becomes available. In some embodiments, upon receiving, from the backpressure module or device of an emulation chip, a signal indicating that a backpressure occurs, the synchronization device may stop issuing steps for the emulation chip and/or issue refresh signals to the emulation chip. In some embodiments, the synchronization device may be aware of both refreshes and backpressure (e.g., via communication with the trace controller of each chip), and the synchronization device thus can control when to generate steps or perform stepping without conflicting with refreshes or backpressure.

The trace controller 610 may determine, based on the FIFO queue 612, whether an amount of data produced from the processor 206 exceeds the throughput to the DCC memory (e.g., the memory 690) for an extended period of time due to poor compression. When it is determined that the amount of data produced from the processor 206 exceeds the throughput to the DCC memory, the trace collector 610 may stall or slow down the emulation run by causing the synchronization device to stop issuing step signals to the emulation chip. The separation between steps may be fixed by a schedule produced by the compiler. However, a synchronization tree structure (e.g., a tree structure shown in FIG. 3A) may allow for flow control from any node in the tree. That is, if READY signals de-assert anywhere, PROCEED signals will synchronously de-assert everywhere. For example, when a backpressure occurs in an emulation chip such that a processor thereof can accumulate data faster than the data can be emptied, READY signals de-asserts at the logic board that includes the emulation chip and then PROCEED signals will synchronously de-assert at every logic board other than that logic board, thereby applying or propagating the backpressure mechanism to other emulation chips on other logic boards.

Whenever backpressure occurs during a major cycle, a backpressure gap may be random. A synchronization device may control each emulation chip or a user memory controller (UMC) thereof (e.g., emulation chip 200 and UMC 203 in FIG. 2) to issue refresh during the backpressure gap. The synchronization device may be aware of the size of an inter-cycle gap and/or the size of a backpressure gap, determine that refresh or backpressure completes, and then cause the major cycle to resume. In this case, the chip cannot be aware when to issue refresh because the chip cannot be aware of information of gap size (e.g., size of an inter-cycle gap and/or size of a backpressure gap), since this depends on the data pattern and can originate in any other chip in the system.

In some embodiments, trace compactors 614 may dequeue data from the FIFO queue 612 and tag the data as to (1) how often and/or (2) during which cycles the data should be captured. The trace compactors may squeeze out bubbles (e.g., NULL data) from the data using valid information (e.g., non-NULL data). In some embodiments, trace compactors may perform ripple shifting on the data based on the valid information and store partial lines, and emit a line of data whenever a complete one is formed. For example, in a processor (e.g., the processor 206 in FIG. 2 and FIG. 6) at each step, any subset of eight bits can be captured. A trace compactor for the processor at this 8 bit level may store bits and emit a byte whenever 8 bits have been received so that on processor's input, the processor has eight bits and eight valids (e.g., eight non-NULL bits). On the processor's output may be an 8-bit value and one valid. In some embodiments, another trace compactor at the next level (e.g., 64 bit level) may input the 8 valid or invalid bytes from the 8-bit level trace compactor, and emit a valid 64-bit value whenever one is complete.

In some embodiments, as these compaction processes continue until an output from a K-bit level trace compactor is available, a trace array 616 as a central collection point may receive either a valid or an invalid K-bit value from the K-bit level trace compactor on each step (e.g., K=512). The trace array may store these values, and based on controls from sequencers (e.g., sequencer 204 in FIG. 2) and virtual logic via hardware control bits (HCBs), determine which cycles of data together form a trace frame. Additional controls may indicate which cycles to capture or not, and whether to store of discard frames.

In some embodiments, a DCC compression module 630 may perform an inline compression on data output from the trace collector 610. This inline compression can offer a number of advantages. First, since there is potentially more data than capacity of the trace subsystem, the inline compression can help to keep up with the DCC throughput. Second, the compression may produce additional trace depth because the emulation system can make better use of the trace memory. Third, there is no extra overhead to performing the compression before upload. In some embodiments, an emulation chip may cause the DCC controller 650 to store the trace data between the two DDR modules in the memory 690 instead of just the one dedicated to DCC, via the memory controller 670.

Figure 7:
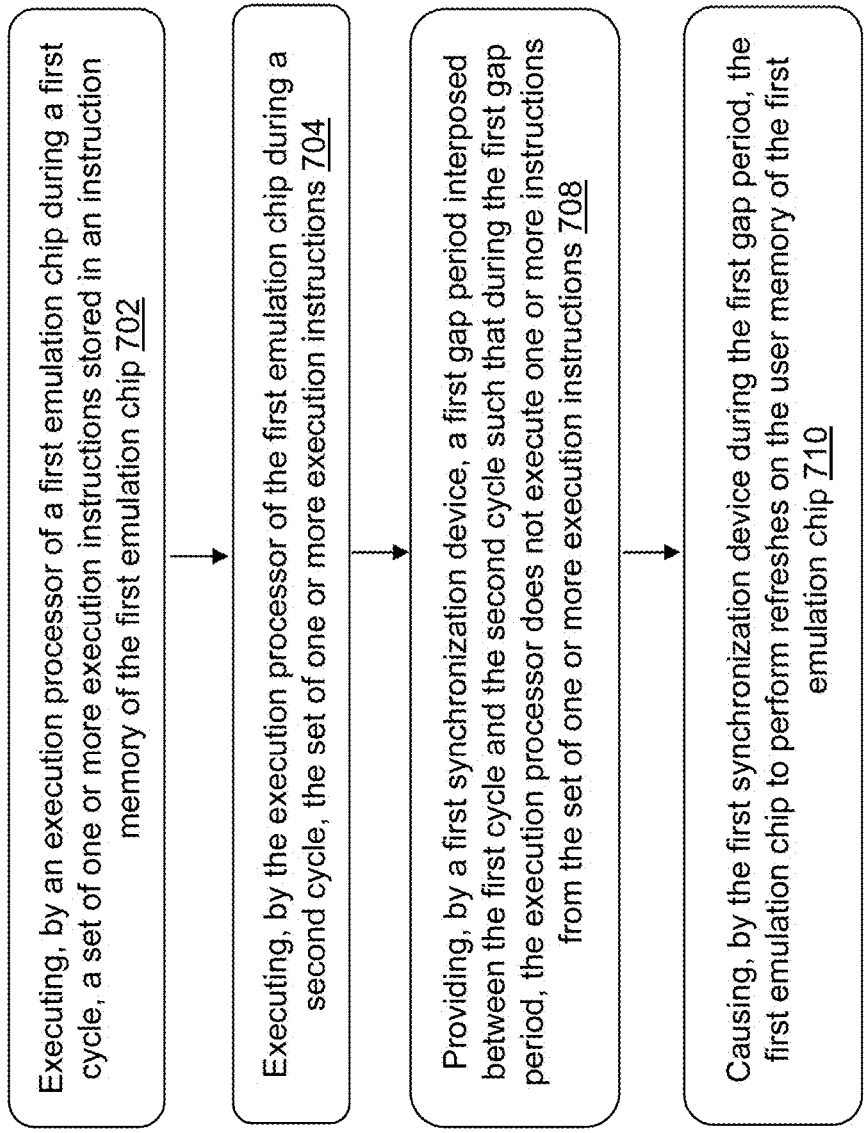
FIG. 7 is a flowchart illustrating an example methodology for performing memory refreshes, according to some embodiments.

FIG. 7 shows execution steps for performing memory refreshes, according to a method 700. The method 700 may include execution steps 702, 704, 706, and 708 performed in a system (e.g., emulation system 100 in FIG. 1) including a first emulation chip (e.g., emulation chip 200 in FIG. 2, one of emulation chips 360-1 in FIG. 3A and FIG. 3B) and a first synchronization device (e.g., synchronization device 370-1 in FIG. 3A). The first emulation chip may include an execution processor (e.g., processor 206 in FIG. 2), a user memory (e.g., user memory 205 in FIG. 2) and an instruction memory (e.g., instruction memory 208 in FIG. 2) configured to store one or more instructions (e.g., instructions 212 in FIG. 2). It should be understood that the steps described herein are merely illustrative and additional or substitute steps should also be considered to be within the scope of this disclosure. Furthermore, methods with a fewer numbers of steps should also be considered to be within the scope of this disclosure.

At step 702, the execution processor of the first emulation chip may execute, during a first cycle (e.g., cycle 401 in FIG. 4), a set of one or more execution instructions stored in the instruction memory.

At step 704, the execution processor of the first emulation chip may execute, during a second cycle (e.g., cycle 403 in FIG. 4), the set of one or more execution instructions. In some embodiments, the first emulation chip may perform no memory refreshes during the first cycle and the second cycle.

At step 706, the first synchronization device may interpose a first gap period (e.g., gap 402 in FIG. 4) between the first cycle and the second cycle such that during the first gap period, the execution processor does not execute one or more instructions from the set of one or more execution instructions. This gap would not occur every cycle. In some embodiments, it may only occur when intra-cycle refreshes are delivered, which is based on an internal timer of a synchronization subsystem (which is asynchronous from the job state). In some embodiments, the system may include a second emulation chip (e.g., another one of emulation chips 360-1 in FIG. 3A and FIG. 3B) including a user memory and an instruction memory.

At step 708, the first synchronization device (e.g., synchronization device 370-1 in FIG. 3A) may cause, during the first gap period, the first emulation chip (e.g., the one of emulation chips 360-1 in FIG. 3A and FIG. 3B) to perform refreshes on the user memory of the first emulation chip. The first synchronization device may cause the second emulation chip (e.g., another one of emulation chips 360-1 in FIG. 3A and FIG. 3B) to perform, during the first gap period, refreshes on the user memory of the second emulation chip. For example, referring to FIG. 3A, being aware of the first gap period, the synchronization device 370-1 on the logic board 350-1 can synchronously cause all of the emulation chips on the same logic board to perform refreshes on the memories of all the emulation chips during the first gap period.

In some embodiments, the first emulation chip may perform, during a second gap period including the first gap period (e.g., the period including period 420, period 422, and gap 402 in FIG. 4), refreshes on the user memory of the first emulation chip. The second gap may overlap with at least one of the first cycle or the second cycle (e.g., period 422 of cycle 401 or period 420 of cycle 403 in FIG. 4). During a period of the second gap overlapping with the at least one of the first cycle or the second cycle, the execution processor of the first emulation chip may be configured not to execute a memory access instruction.

In some embodiments, the first emulation chip further may include a trace controller (e.g., trace controller 610 in FIG. 6) including a first-in first-out (FIFO) queue (e.g., FIFO queue 612 in FIG. 6). The trace controller may receive, at the FIFO queue, an output of the execution processor (e.g., processor 206 in FIG. 6) to generate a trace from an output of the FIFO queue. The trace controller may determine whether at least a predetermined percentage of the FIFO queue is full. For example, to avoid overflow, the trace controller may determine whether at least 90% of the FIFO queue is full (to check whether the queue is almost full). In response to determination that at least the predetermined percentage of the FIFO queue is full, the trace controller may cause the first synchronization device (e.g., synchronization device 370-1 in FIG. 6) to stop issuing to the first emulation chip (e.g., one of emulation chips 360-1 in FIG. 3B) a signal indicating a start of a cycle (e.g., step signals 382 generated by step generators 380-1 in FIG. 3B). The system may further include a second emulation chip (e.g., another one of emulation chips 360-1 in FIG. 3B). In response to determination that at least the predetermined percentage of the FIFO queue is full, the trace controller of the first emulation chip may cause the first synchronization device to stop issuing to the second emulation chip a signal indicating a start of a cycle. For example, being aware of backpressure occurring in the one of emulation chips 360-1 by communicating with the trace collector 610 of the one emulation chip, the synchronization device 370-1 may stop issuing a step signal to the one emulation chip via a step generator of synchronization device 370-1 corresponding to the one emulation chip.

In some embodiments, the system may further include a second synchronization device (e.g., synchronization device 370-2 in FIG. 3A). In response to determination that at least the predetermined percentage of the FIFO queue of the first emulation chip is full, the second synchronization device may stop issuing a signal indicating a start of a cycle. For example, being aware of the backpressure occurring in the one of emulation chips 360-1, the first synchronization device may de-assert READY signal, which causes CSC 340 (see FIG. 3A) to de-assert PROCEED signals for all of synchronization devices (e.g., devices 370-1 to 370-N in FIG. 3A), thereby applying or propagating the backpressure management to all emulation chips on logic boards 350-1 to 350-N.

Figure 8:
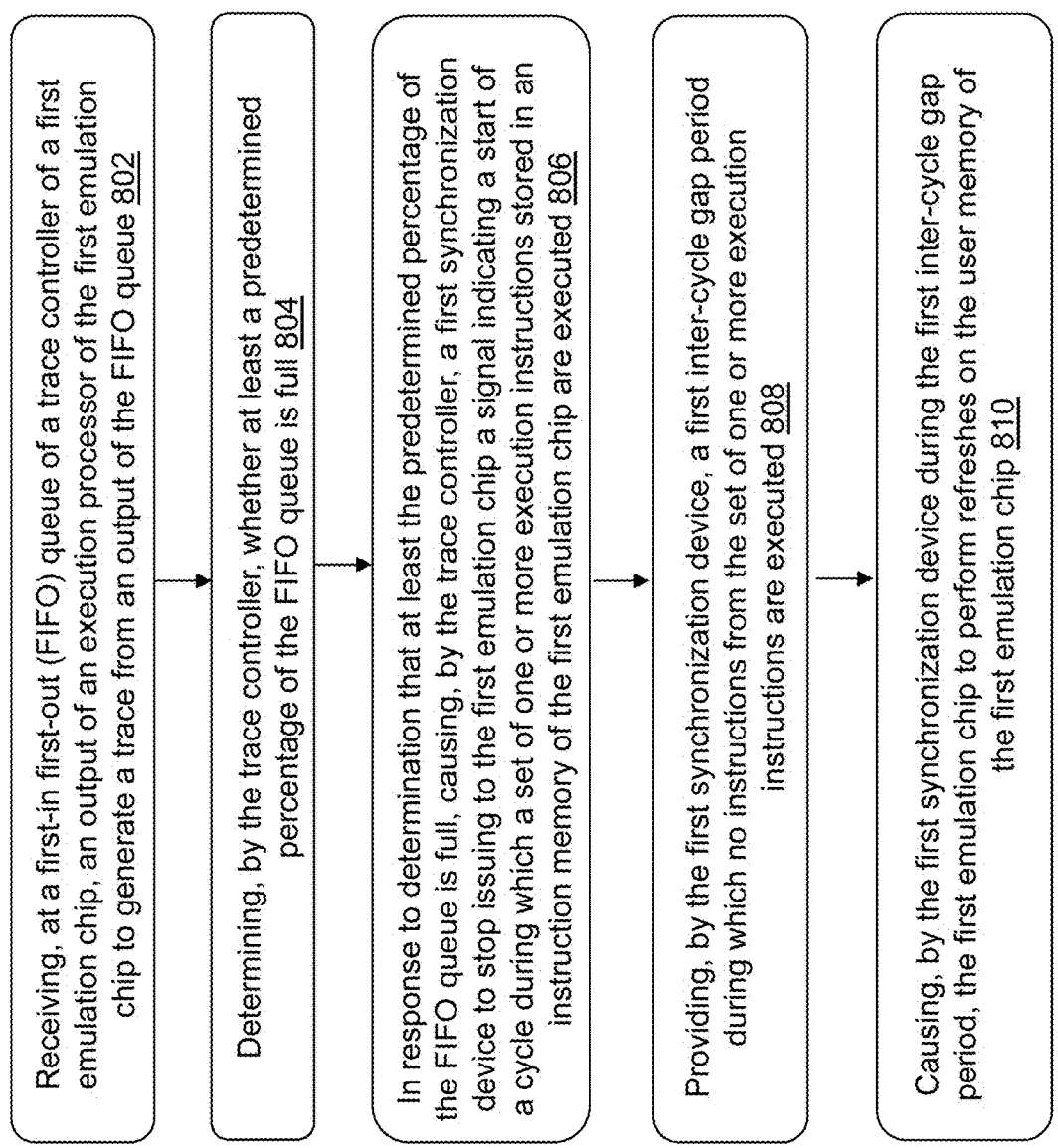
FIG. 8 is a flowchart illustrating an example methodology for performing a backpressure management process, according to some embodiments.

FIG. 8 shows execution steps for performing a backpressure management, according to a method 800. The method 800 may include execution steps 802, 804, 806, 808, and 810 performed in an emulation system (e.g., emulation system 100 in FIG. 1) including a first emulation chip (e.g., emulation chip 200 in FIG. 2, one of emulation chips 360-1 in FIG. 3A and FIG. 3B) and a first synchronization device (e.g., synchronization device 370-1 in FIG. 3A), the first emulation chip including an execution processor (e.g., processor 206 in FIG. 2), a trace controller (e.g., trace controller 610 in FIG. 6), a user memory (e.g., user memory 205 in FIG. 2) and an instruction memory (e.g., instruction memory 208 in FIG. 2) configured to store one or more instructions. It should be understood that the steps described herein are merely illustrative and additional or substitute steps should also be considered to be within the scope of this disclosure. Furthermore, methods with a fewer numbers of steps should also be considered to be within the scope of this disclosure.

At step 802, the trace controller may receive, at a first-in first-out (FIFO) queue (e.g., FIFO queue 612 in FIG. 6), an output of the execution processor to generate a trace from an output of the FIFO queue.

At step 804, the trace controller may determine whether at least a predetermined percentage of the FIFO queue is full. In some embodiments, the predetermined percentage may be one of 70%, 80% or 90%.

At step 806, in response to determination that at least the predetermined percentage of the FIFO queue is full, the trace controller may cause the first synchronization device (e.g., synchronization device 370-1 in FIG. 6) to stop issuing to the first emulation chip a signal indicating a start of a cycle during which a set of one or more execution instructions stored in the instruction memory are executed. For example, being aware of backpressure occurring in the one of emulation chips 360-1 by communicating with the trace collector 610 of the one emulation chip, the synchronization device 370-1 may stop issuing a step signal to the one emulation chip via a step generator of synchronization device 370-1 corresponding to the one emulation chip.

In some embodiments, the emulation system may further include a second emulation chip (e.g., another one of emulation chips 360-1 in FIG. 3A and FIG. 3B) including a user memory and an instruction memory. In response to determination that at least the predetermined percentage of the FIFO queue of the first emulation chip is full, the trace controller may cause the first synchronization device to stop issuing to the second emulation chip a signal indicating a start of a cycle during which the set of one or more execution instructions are executed. For example, being aware of backpressure occurring in the one of emulation chips 360-1, the synchronization device 370-1 on the logic board 350-1 can synchronously stop issuing a step signal to all of the emulation chips on the same logic board via step generators of synchronization device 370-1 corresponding to all of the emulation chips.

The emulation system may further include a second synchronization device (e.g., synchronization device 370-2 in FIG. 3A). In response to determination that at least the predetermined percentage of the FIFO queue of the first emulation chip is full, the trace controller may cause the second synchronization device to stop issuing a signal indicating a start of a cycle during which the set of one or more execution instructions are executed. For example, being aware of the backpressure occurring in the one of emulation chips 360-1, the first synchronization device may de-assert READY signal, which causes CSC 340 (see FIG. 3A) to de-assert PROCEED signals for all of synchronization devices (e.g., devices 370-1 to 370-N in FIG. 3A), thereby applying or propagating the backpressure management to all emulation chips on logic boards 350-1 to 350-N.

At step 808, the first synchronization device may interpose a first inter-cycle gap period (e.g., gap 402 in FIG. 4) during which no instructions from the set of one or more execution instructions are executed. This gap would not occur every cycle. In some embodiments, it may only occur when intra-cycle refreshes are delivered, which is based on an internal timer of a synchronization subsystem (which is asynchronous from the job state).

At step 810, the first synchronization device may cause, during the first inter-cycle gap period, the first emulation chip to perform refreshes on the user memory of the first emulation chip. In some embodiments, the first synchronization device may cause, during the first inter-cycle gap period, the second emulation chip, to perform refreshes on the user memory of the second emulation chip. For example, referring to FIG. 3A, being aware of the first gap period, the synchronization device 370-1 on the logic board 350-1 can synchronously cause all of the emulation chips on the same logic board to perform refreshes on the memories of all the emulation chips during the first gap period.

Figure 9:
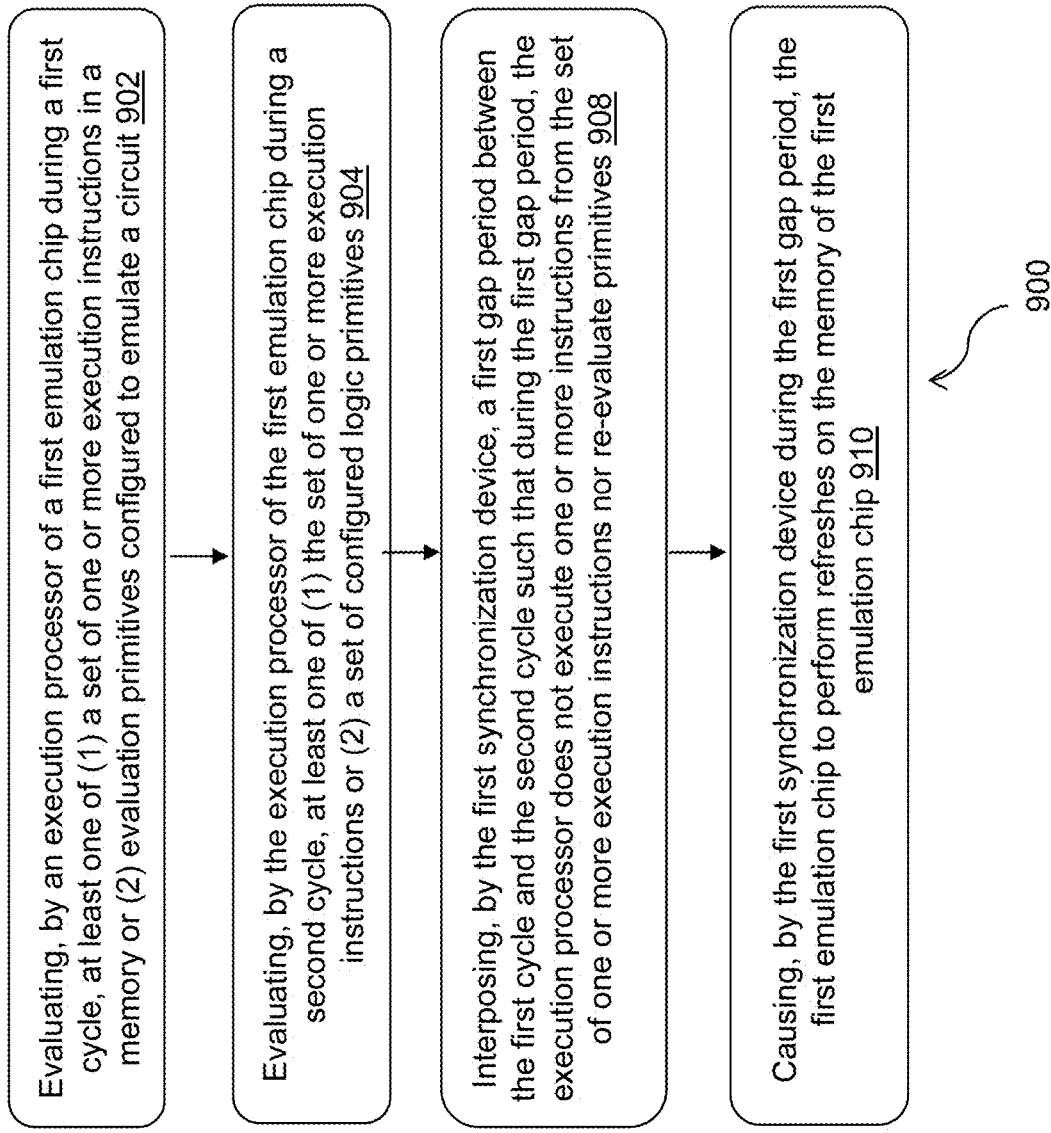
FIG. 9 is a flowchart illustrating an example methodology for performing memory refreshes, according to some embodiments.

FIG. 9 shows execution steps for performing memory refreshes, according to a method 900. The method 900 may include execution steps 902, 904, 906, and 908 performed in a system (e.g., emulation system 100 in FIG. 1) including a first emulation chip (e.g., emulation chip 200 in FIG. 2, one of emulation chips 360-1 in FIG. 3A and FIG. 3B) and a first synchronization device (e.g., synchronization device 370-1 in FIG. 3A). The first emulation chip may include a processor (e.g., processor 206 in FIG. 2), a memory (e.g., data memory array 202, instruction memory 208, or other user memories 205 for modeling memories of the design under test in FIG. 2) at least a portion of which requires refreshes (e.g., DRAM). It should be understood that the steps described herein are merely illustrative and additional or substitute steps should also be considered to be within the scope of this disclosure. Furthermore, methods with a fewer numbers of steps should also be considered to be within the scope of this disclosure.

At step 902, the processor of the first emulation chip may evaluate, during a first cycle (e.g., cycle 401 in FIG. 4), at least one of (1) a set of one or more execution instructions in the memory or (2) evaluation primitives (e.g., primitive logic gates) configured to emulate a circuit.

At step 904, the processor of the first emulation chip may evaluate, during a second cycle (e.g., cycle 403 in FIG. 4), at least one of the set of one or more execution instructions or a set of configured logic primitives (e.g., primitive logic gates).

At step 906, the first synchronization device may interpose a first gap period (e.g., gap 402 in FIG. 4) between the first cycle and the second cycle such that during the first gap period, the processor does not evaluate one or more instructions from the set of one or more execution instructions or re-evaluate primitives (e.g., primitive logic gates). This gap would not occur every cycle. It may only occur when intra-cycle refreshes are delivered, which is based on an internal timer of a synchronization subsystem (which is asynchronous from the job state).

At step 908, the first synchronization device (e.g., synchronization device 370-1 in FIG. 3A) may cause, during the first gap period, the first emulation chip (e.g., the one of emulation chips 360-1 in FIG. 3A and FIG. 3B) to perform refreshes on the memory of the first emulation chip.

The emulation system may further include a second emulation chip (e.g., another one of emulation chips 360-1 in FIG. 3A and FIG. 3B) including a memory. The first synchronization device may cause, during the first gap period, the second emulation chip, to perform refreshes on the memory of the second emulation chip. For example, referring to FIG. 3A, being aware of the first gap period, the synchronization device 370-1 on the logic board 350-1 can synchronously cause all of the emulation chips on the same logic board to perform refreshes on the memories of all the emulation chips during the first gap period.

The emulation system may issue or perform refreshes only as often as needed during interactions between (1) when the emulation cycle is run (executed), (2) when refreshes are issued, and (3) when memory accesses are scheduled. When memory accesses are scheduled during a memory access period (e.g., a period between period 420 and period 422 in FIG. 4), the first synchronization device may cause the first emulation chip not to perform refreshes on the memory of the first emulation chip during the memory access period. When memory accesses are scheduled during a memory access period of the first cycle (e.g., a period between period 420 and period 422 in FIG. 4), the first synchronization device may cause the first emulation chip to perform refreshes on the memory of the first emulation chip during the first cycle except for the memory access period (e.g., period 420 or period 422 in FIG. 4). When memory accesses are not scheduled during a non-memory access period of the first cycle (e.g., period 420 or period 422 in FIG. 4), the first synchronization device may cause the first emulation chip to perform refreshes on the memory of the first emulation chip during the non-memory access period (e.g., period 420 or period 422 in FIG. 4) and during the first gap period (e.g., gap period 402 in FIG. 4).

The first emulation chip may further include a trace controller (e.g., trace controller 610 in FIG. 6). The trace controller may receive, at a first-in first-out (FIFO) queue of the trace controller (e.g., FIFO queue 612 in FIG. 6), an output of the processor (e.g., processor 206 in FIG. 6) to generate a trace from an output of the FIFO queue. The trace controller may determine whether at least a predetermined percentage of the FIFO queue is full. For example, to avoid overflow, the trace controller may determine whether at least 90% of the FIFO queue is full (to check whether the queue is almost full). In response to determining that at least a predetermined percentage of the FIFO queue is full, the trace controller may cause the first synchronization device (e.g., synchronization device 370-1 in FIG. 6) to stop issuing to the first emulation chip (e.g., one of emulation chips 360-1 in FIG. 3B) a signal indicating a start of a cycle (e.g., step signals 382 generated by step generators 380-1 in FIG. 3B). The emulation system may further include a second emulation chip (e.g., another one of emulation chips 360-1 in FIG. 3B). In response to determination that at least a predetermined percentage of the FIFO queue is full, the trace controller may cause the first synchronization device to stop issuing to the second emulation chip a signal indicating a start of a cycle. For example, being aware of backpressure occurring in the one of emulation chips 360-1 by communicating with the trace collector 610 of the one emulation chip, the synchronization device 370-1 may stop issuing a step signal to the one emulation chip via a step generator of synchronization device 370-1 corresponding to the one emulation chip.

The emulation system may further include a second synchronization device (e.g., synchronization device 370-2 in FIG. 3A). In response to determination that at least a predetermined percentage of the FIFO queue of the first emulation chip is full, the second synchronization device may be caused to stop issuing a signal indicating a start of a cycle. For example, being aware of the backpressure occurring in the one of emulation chips 360-1, the first synchronization device may de-assert READY signal, which causes CSC 340 (see FIG. 3A) to de-assert PROCEED signals for all of synchronization devices (e.g., devices 370-1 to 370-N in FIG. 3A), thereby applying or propagating the backpressure management to all emulation chips on logic boards 350-1 to 350-N.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, and the like. When a process corresponds to a function, the process termination may correspond to a return of the function to a calling function or a main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of this disclosure or the claims.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the claimed features or this disclosure. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module, which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may include RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A method of refreshing memories of an emulation system including a first emulation chip and a first synchronization device, the first emulation chip including a processor and a memory at least a portion of which requires refreshes, the method comprising:
    evaluating, by the processor of the first emulation chip during a first cycle, at least one of a set of one or more execution instructions in the memory or evaluation primitives configured to emulate a circuit;
    evaluating, by the processor of the first emulation chip during a second cycle, at least one of the set of one or more execution instructions or a set of configured logic primitives;
    interposing, by the first synchronization device, a first gap period between the first cycle and the second cycle and including a duration overlap with the first cycle or the second cycle such that during the first gap period, the processor does not evaluate one or more instructions from the set of one or more execution instructions or re-evaluate primitives; and
    causing, by the first synchronization device during the first gap period, the first emulation chip to perform refreshes on the memory of the first emulation chip, the first emulation chip performing at least one refresh on the memory during the duration overlap of the first gap period with the first cycle or the second cycle.

2. The method according to claim 1, wherein the emulation system further includes a second emulation chip including a memory, and the method further includes causing, by the first synchronization device during the first gap period, the second emulation chip, to perform refreshes on the memory of the second emulation chip.

3. The method according to claim 1, further comprising:
    when memory accesses are scheduled during a memory access period, causing, by the first synchronization device, the first emulation chip not to perform refreshes on the memory of the first emulation chip during the memory access period.

4. The method according to claim 1, further comprising:
    when memory accesses are scheduled during a memory access period of the first cycle, causing, by the first synchronization device, the first emulation chip to perform refreshes on the memory of the first emulation chip during the first cycle except for the memory access period.

5. The method according to claim 1, further comprising:
    when memory accesses are not scheduled during a non-memory access period of the first cycle, causing, by the first synchronization device, the first emulation chip to perform refreshes on the memory of the first emulation chip during the non-memory access period and during the first gap period.

6. The method according to claim 1, wherein the first emulation chip further includes a trace controller, and the method further comprises:
    receiving, at a first-in first-out (FIFO) queue of the trace controller, an output of the processor to generate a trace from an output of the FIFO queue;
    determining, by the trace controller, whether at least a predetermined percentage of the FIFO queue is full; and
    in response to determining that at least a predetermined percentage of the FIFO queue is full, causing, by the trace controller, the first synchronization device to stop issuing to the first emulation chip a signal indicating a start of a cycle.

7. The method according to claim 6, wherein the emulation system further includes a second emulation chip, and wherein the method further comprises:
    in response to determination that at least a predetermined percentage of the FIFO queue is full, causing, by the trace controller, the first synchronization device to stop issuing to the second emulation chip a signal indicating a start of a cycle.

8. The method according to claim 6, wherein the emulation system further comprises a second synchronization device, and wherein the method further comprises:
    in response to determination that at least a predetermined percentage of the FIFO queue of the first emulation chip is full, causing the second synchronization device to stop issuing a signal indicating a start of a cycle.

9. A system, comprising:
    a first emulation chip comprising a processor and a memory at least a portion of which requires refreshes; and
    a first synchronization device, wherein:
    the processor of the first emulation chip is configured to:
        evaluate, during a first cycle, at least one of a set of one or more execution instructions in the memory or evaluation primitives configured to emulate a circuit; and evaluate, during a second cycle, at least one of the set of one or more execution instructions or a set of configured logic primitives, the first synchronization device is configured to:
interpose a first gap period between the first cycle and the second cycle and including a duration overlap with the first cycle or the second cycle such that during the first gap period, the processor does not evaluate one or more instructions from the set of one or more execution instructions or re-evaluate primitives; and
cause, during the first gap period, the first emulation chip to perform refreshes on the memory of the first emulation chip, the first emulation chip performing at least one refresh on the memory during the duration overlap of the first gap period with the first cycle or the second cycle.

10. The system according to claim 9, further comprising: a second emulation chip comprising a memory, wherein the first synchronization device is configured to cause the second emulation chip to perform, during the first gap period, refreshes on the memory of the second emulation chip.

11. The system according to claim 9, wherein when memory accesses are scheduled during a memory access period, the first synchronization device is configured to cause the first emulation chip not to perform refreshes on the memory of the first emulation chip during the memory access period.

12. The system according to claim 9, wherein when memory accesses are scheduled during a memory access period of the first cycle, the first synchronization device is configured to cause the first emulation chip to perform refreshes on the memory of the first emulation chip during the first cycle except for the memory access period.

13. The system according to claim 9, wherein when memory accesses are not scheduled during a non-memory access period of the first cycle, the first synchronization device is configured to cause the first emulation chip to perform refreshes on the memory of the first emulation chip during the non-memory access period and during the first gap period.

14. The system according to claim 9, wherein the first emulation chip further includes a trace controller including a first-in first-out (FIFO) queue, and the trace controller is configured to:
receive, at the FIFO queue, an output of the processor to generate a trace from an output of the FIFO queue;
determine whether at least a predetermined percentage of the FIFO queue is full; and
in response to determination that at least a predetermined percentage of the FIFO queue is full, cause the first synchronization device to stop issuing to the first emulation chip a signal indicating a start of a cycle.

15. The system according to claim 14, further comprising a second emulation chip, wherein in response to determination that at least a predetermined percentage of the FIFO queue is full, the trace controller of the first emulation chip is configured to cause the first synchronization device to stop issuing to the second emulation chip a signal indicating a start of a cycle.

16. The system according to claim 14, further comprising a second synchronization device, wherein in response to determination that at least a predetermined percentage of the FIFO queue of the first emulation chip is full, the second synchronization device is configured to stop issuing a signal indicating a start of a cycle.

17. A method of refreshing memories of an emulation system including a first emulation chip and a first synchronization device, the first emulation chip including a processor, a trace controller, and a memory at least a portion of which requires refreshes, the method comprising:
receiving, at a first-in first-out (FIFO) queue of the trace controller, an output of the processor to generate a trace from an output of the FIFO queue;
determining, by the trace controller, whether at least a predetermined percentage of the FIFO queue is full;
in response to determination that at least a predetermined percentage of the FIFO queue is full, causing, by the trace controller, the first synchronization device to stop issuing to the first emulation chip a signal indicating a start of a cycle during which at least one of a set of one or more execution instructions in the memory or evaluation primitives configured to emulate a circuit are evaluated;
interposing, by the first synchronization device, a first inter-cycle gap period during which no instructions from the set of one or more execution instructions or re-evaluate primitives are evaluated; and
causing, by the first synchronization device during the first inter-cycle gap period, the first emulation chip to perform refreshes on the memory of the first emulation chip.

18. The method according to claim 17, wherein the emulation system further comprises a second emulation chip comprising a memory; and
wherein the method further comprises:
in response to determination that at least a predetermined percentage of the FIFO queue of the first emulation chip is full, causing, by the trace controller, the first
synchronization device to stop issuing to the second emulation chip a signal indicating a start of a cycle during which at least one of (1) the set of one or more execution instructions or (2) the evaluation primitives are evaluated.

19. The method according to claim 18, further comprising:
causing, by the first synchronization device during the first inter-cycle gap period, the second emulation chip, to perform refreshes on the memory of the second emulation chip.

20. The method according to claim 17, wherein the emulation system further comprises a second synchronization device; and the method further comprises:
in response to determination that at least a predetermined percentage of the FIFO queue of the first emulation chip is full, causing the second synchronization device to stop issuing a signal indicating a start of a cycle which at least one of the set of one or more execution instructions or the evaluation primitives are evaluated.

* * * * *